United States Patent
Teng et al.

(10) Patent No.: US 12,191,334 B2
(45) Date of Patent: Jan. 7, 2025

(54) SEMICONDUCTOR DEVICE WITH BUFFER LAYER AND METHOD OF FORMING

(71) Applicant: TAIWAN SEMICONDUCTOR MANUFACTURING COMPANY LIMITED, Hsin-Chu (TW)

(72) Inventors: Ya Chun Teng, Tainan (TW); Yun-Wei Cheng, Taipei (TW); Chien Ming Sung, Tainan (TW)

(73) Assignee: TAIWAN SEMICONDUCTOR MANUFACTURING COMPANY LIMITED, Hsin-Chu (TW)

( * ) Notice: Subject to any disclaimer, the term of this patent is extended or adjusted under 35 U.S.C. 154(b) by 420 days.

(21) Appl. No.: 17/536,280

(22) Filed: Nov. 29, 2021

(65) Prior Publication Data

US 2022/0085090 A1    Mar. 17, 2022

Related U.S. Application Data

(62) Division of application No. 16/572,994, filed on Sep. 17, 2019, now Pat. No. 11,189,653.

(51) Int. Cl.
*H01L 27/146* (2006.01)

(52) U.S. Cl.
CPC .. *H01L 27/14629* (2013.01); *H01L 27/14621* (2013.01); *H01L 27/1463* (2013.01); *H01L 27/14645* (2013.01); *H01L 27/14685* (2013.01)

(58) Field of Classification Search
None
See application file for complete search history.

(56) References Cited

U.S. PATENT DOCUMENTS

| | | | |
|---|---|---|---|
| 2009/0242948 A1 | 10/2009 | Barrett et al. | |
| 2014/0362267 A1 | 12/2014 | Kagawa et al. | |
| 2015/0115382 A1* | 4/2015 | Wu | H01L 27/14689 438/70 |
| 2015/0236067 A1* | 8/2015 | JangJian | H01L 27/14683 438/70 |
| 2017/0133429 A1 | 5/2017 | Cheng et al. | |
| 2017/0278881 A1* | 9/2017 | Hsu | H01L 27/14623 |

FOREIGN PATENT DOCUMENTS

| | | |
|---|---|---|
| CN | 109285848 A | 1/2019 |
| CN | 110071131 A | 7/2019 |
| TW | 201001685 A | 1/2010 |
| TW | 201715720 A | 5/2017 |

OTHER PUBLICATIONS

First Office Action received in corresponding Chinese patent application No. 202010837996.7, dated Jul. 22, 2024, 14 pages.

* cited by examiner

*Primary Examiner* — Jay C Chang
(74) *Attorney, Agent, or Firm* — Cooper Legal Group, LLC

(57) ABSTRACT

A semiconductor device includes a pixel array comprising a first pixel and a second pixel. The semiconductor device includes a metal structure overlying a portion of a substrate between the first pixel and the second pixel. The semiconductor device includes a first barrier layer adjacent a sidewall of the metal structure. The semiconductor device includes a passivation layer adjacent a sidewall of the first barrier layer. The first barrier layer is between the passivation layer and the metal structure.

20 Claims, 24 Drawing Sheets

SEMICONDUCTOR DEVICE WITH BUFFER LAYER AND METHOD OF FORMING

RELATED APPLICATIONS

This application is a divisional of and claims priority to U.S. patent application Ser. No. 16/572,994, titled "SEMICONDUCTOR DEVICE WITH BUFFER LAYER AND METHOD OF FORMING" and filed on Sep. 17, 2019, which is incorporated herein by reference.

BACKGROUND

A semiconductor device, such as a complementary metal-oxide-semiconductor (CMOS) image sensor, comprises a pixel array configured to detect radiation, such as light, impinging on pixels of the pixel array. The CMOS image sensor comprises a grid array that defines optical paths through which radiation is guided towards each pixel. Color filter material is disposed within the optical paths between grid structures of the grid array to filter radiation so that only certain wavelengths of radiation reach each pixel.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
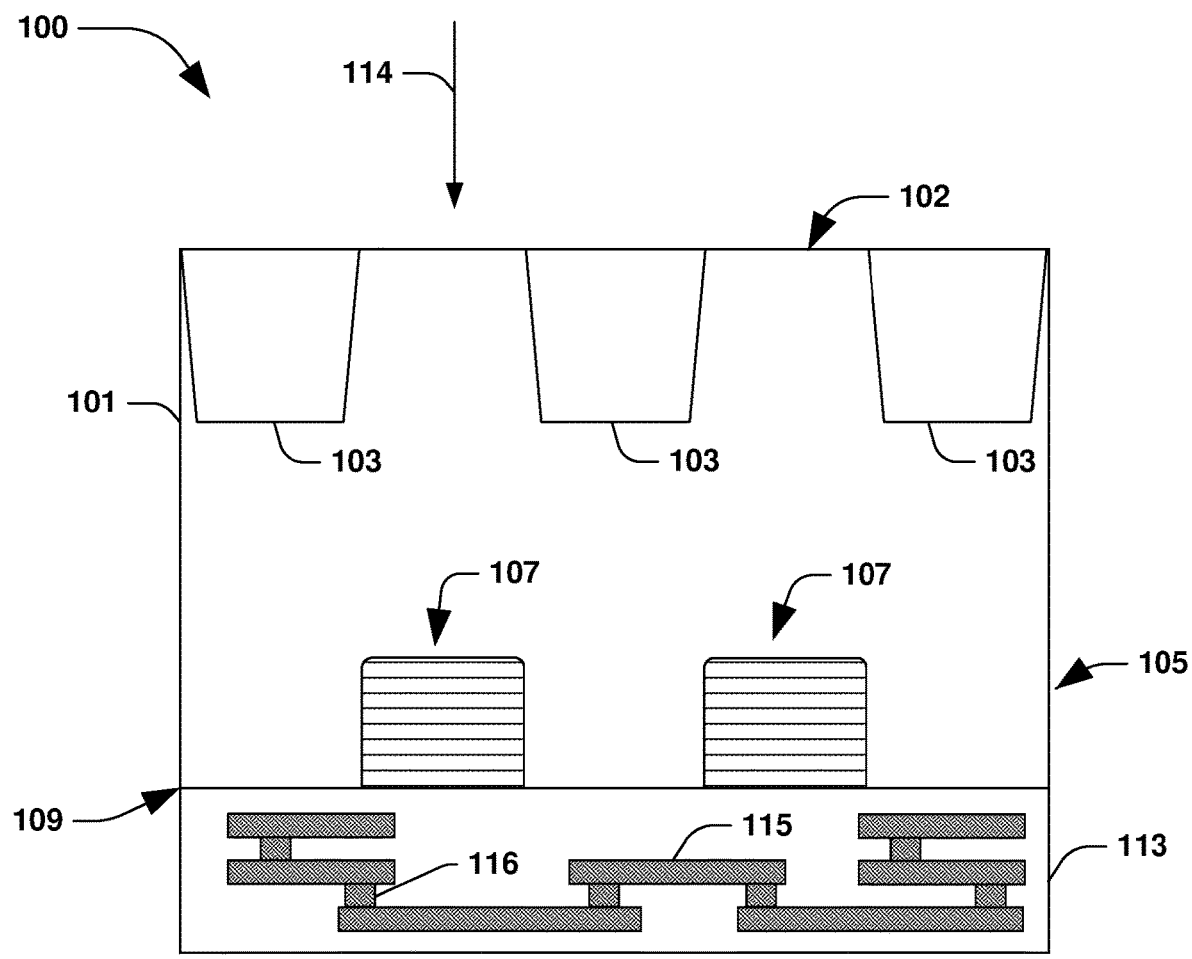
FIG. 1A-1J are illustrations of cross-sectional views of a semiconductor device at various stages of fabrication, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, a semiconductor device comprising a pixel array is provided. In some embodiments, the semiconductor device comprises a grid array formed over the pixel array. In some embodiments, the grid array comprises grid structures formed over and between pixels of the pixel array. The grid structures comprise, among other things, metal structures configured to reflect radiation to create optical paths for guiding radiation to the pixels. In some embodiments, a first barrier layer is formed adjacent to one or more sidewalls of each metal structure. In some embodiments, the first barrier layer is further disposed over each of the metal structures. In some embodiments, the semiconductor device comprises a second barrier layer underlying each of the metal structures. In some embodiments, the semiconductor device comprises a passivation layer adjacent to a sidewall of the first barrier layer, such that the first barrier layer is between the passivation layer and the metal structures. In some embodiments, the semiconductor device comprises a CMOS image sensor, such as a backside illumination CMOS image sensor.

In some embodiments, the first barrier layer reduces diffusion of metal within the metal structures into optical paths between the grid structures. In some embodiments, the first barrier layer provides improved adhesion between the metal structures and surrounding non-metal materials, such as the passivation layer.

FIGS. 1A-1J are cross-sectional views of a semiconductor device 100 formed with a second barrier layer 118, in accordance with some embodiments. In some embodiments, the semiconductor device 100 comprises a CMOS image sensor, such as a backside illumination CMOS image sensor. Referring to FIG. 1A, a substrate 101 comprising a pixel array 105 is provided, according to some embodiments. The substrate 101 has a front side 109 and a back side 102. In some embodiments, the substrate 101 is a monocrystalline silicon substrate, a doped substrate comprising single crystalline silicon with a <100> crystallographic orientation, or other suitable material. The pixel array 105 comprises a plurality of pixels 107, such as photodiodes, phototransistors, etc., that are formed within the substrate 101 or over the front side 109 of the substrate. In some embodiments, the pixels 107 are configured to sense radiation, such as incident light, which is projected towards the substrate 101 from the back side 102. Radiation entering the substrate 101 through the back side 102 is detected by one or more of the pixels 107. In some embodiments, the pixels 107 comprise pinned layer photodiodes, photogates, reset transistors, source follower transistors, transfer transistors, etc. The pixels 107 can vary from one another to have different junction depths, thicknesses, widths, and so forth. Even though 2 pixels are depicted, any number of pixels can be formed within the substrate 101. In some embodiments, isolation regions 103, such as backside isolation regions, are disposed between the pixels 107, such that the isolation regions 103 are offset from the pixels 107 in a direction perpendicular to a direction 114 that the radiation travels to enter the substrate 101 and be detected by the pixels 107. In some embodiments, the isolation regions 103 are shallow trench isolation (STI) structures.

An interconnect structure 113 is formed over the front side 109 of the substrate 101, according to some embodiments. In some embodiments, the interconnect structure 113 comprises a plurality of patterned dielectric layers and conductive layers that provide interconnections, such as wiring, between various doped features, circuitry, and input/output of the semiconductor device 100. In some embodiments, the interconnect structure 113 comprises an interlayer dielectric and multilayer interconnect structures, such as contacts, vias, metal lines, etc. For purposes of illustration, the interconnect structure 113 comprises conductive lines 115 and vias/contacts 116 illustrated in FIG. 1A that are merely exemplary, and the actual positioning and configuration can vary depending upon design needs.

In some embodiments, additional layers are formed between the interconnect structure 113 and the front side 109 of the substrate 101. For examples, interlayer dielectrics, intermetal dielectrics, metal blocks, redistribution layers, etc. may be present between the interconnect structure 113 and the front side 109 of the substrate 101. In some embodiments, additional layers are formed on a surface of the interconnect structure 113 facing away from the substrate 101, such as interlayer dielectrics, intermetal dielectrics, redistribution layers, an application-specific integrated circuit, etc. In some embodiments, a carrier substrate is bonded with the substrate 101 through the interconnect structure 113 and any additional layers present on the front side 109 of the substrate 101 so that processing of the back side 102 of the substrate 101 can be performed as described below.

In some embodiments, the semiconductor device 100 may include other regions not shown in FIG. 1A or in the foregoing figures. For example, where the semiconductor device 100 is a backside illumination CMOS image sensor, the backside illumination CMOS image sensor may include a pixel region (at least a portion of which is shown), a periphery region (not shown), a contact pad region (not shown), a black level calibration region (not shown), a backside scribe line region (not shown), etc.

Figure 1B:
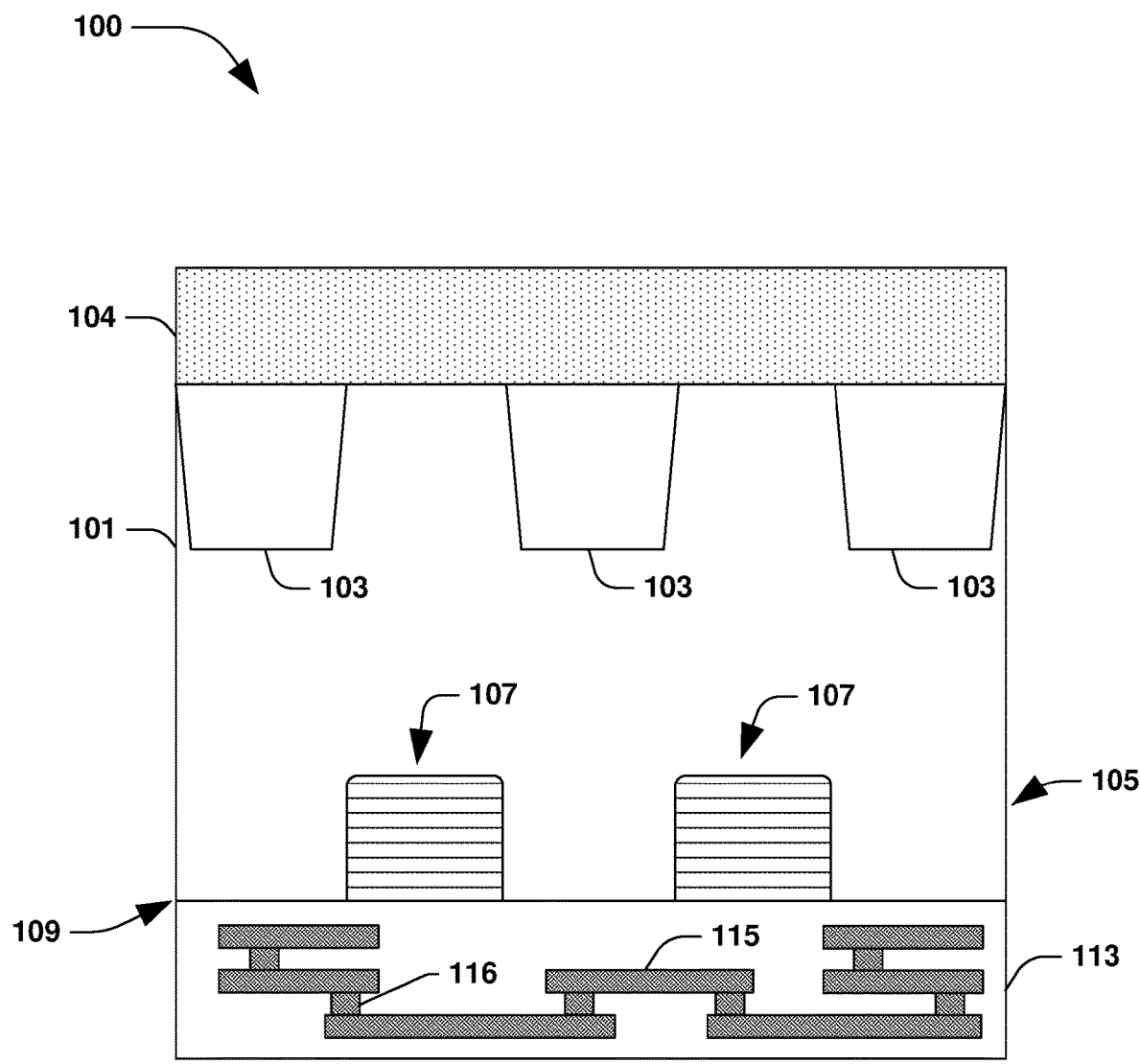

FIGS. 1B-1J are cross-sectional views of a grid array being formed over the substrate 101. Referring to FIG. 1B, a first dielectric layer 104 is formed over the substrate 101, in accordance with some embodiments. In some embodiments, the first dielectric layer 104 comprises a material that is substantially optically transparent to the wavelengths of radiation intended to be received by the pixels 107. In some embodiments, the first dielectric layer 104 comprises $SiO_2$ or a low-k material. Low-k dielectric materials have a k-value (dielectric constant) lower than about 3.9. Some low-k dielectric materials have a k-value lower than about 3.5 and may have a k-value lower than about 2.5.

Figure 1C:
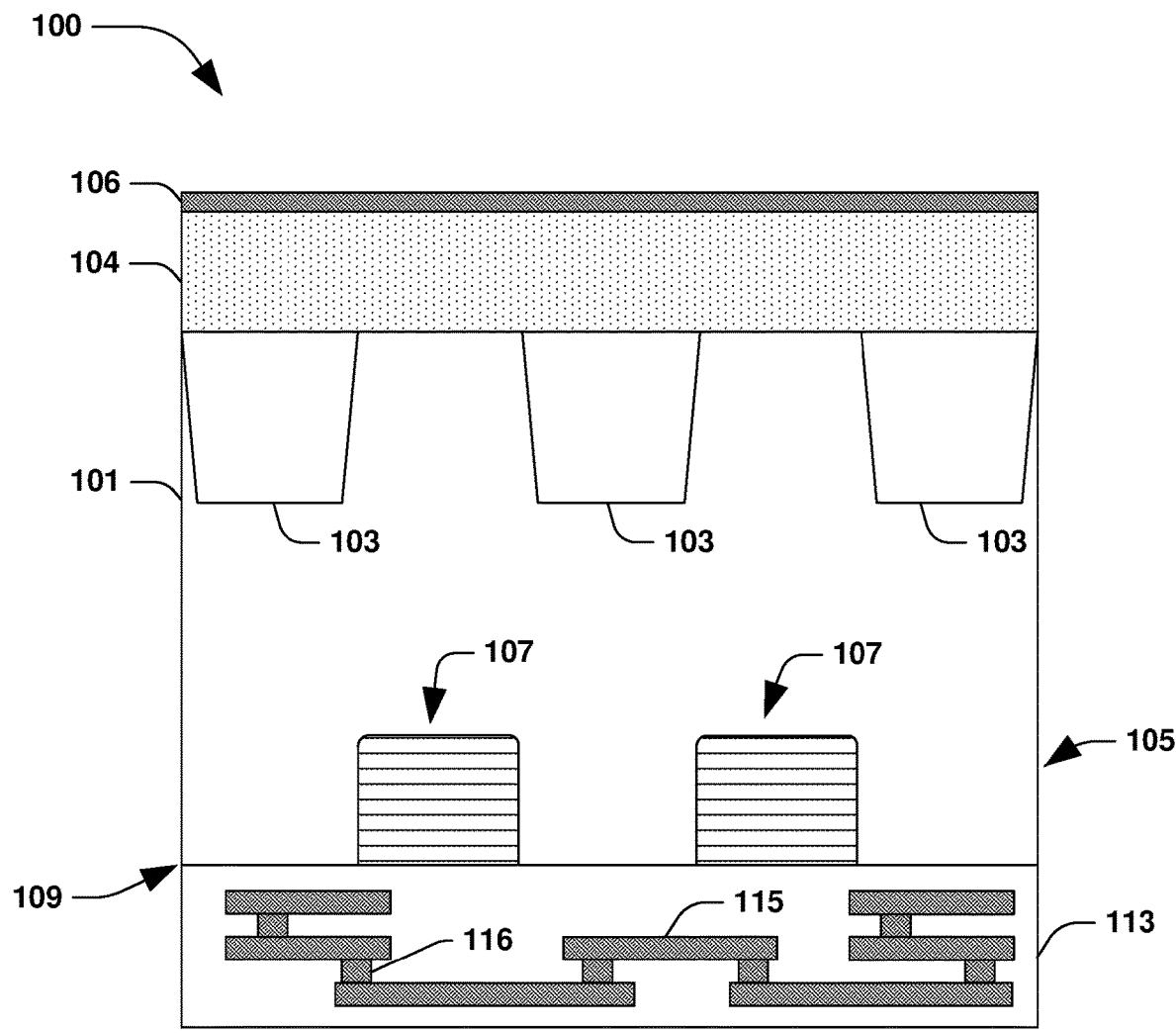

Referring to FIG. 1C, a first barrier layer 106 is formed over the first dielectric layer 104, in accordance with some embodiments. In some embodiments, the first barrier layer 106 comprises a metal material. Examples of the metal material include but are not limited to W, Cu, Al, Co, Ni, Ti, Ta, alloys thereof, or other suitable metal material. In some embodiments, the first barrier layer 106 comprises a dielectric material. Examples of the dielectric material include but are not limited to $SiO_x$, $SiN_x$, $SiC_x$, $TiN_x$, $TaN_x$, $HfO_x$, $TaO_x$, $AlO_x$, or other suitable dielectric material, where x is a value greater than or equal to 1. In some embodiments, the first barrier layer 106 comprises a single layer of material. In some embodiments, the first barrier layer 106 comprises multiple layers of material. For example, the first barrier layer 106 may comprise a layer of $SiN_x$, a layer of $SiO_x$, and another layer of $SiN_x$.

Figure 1D:
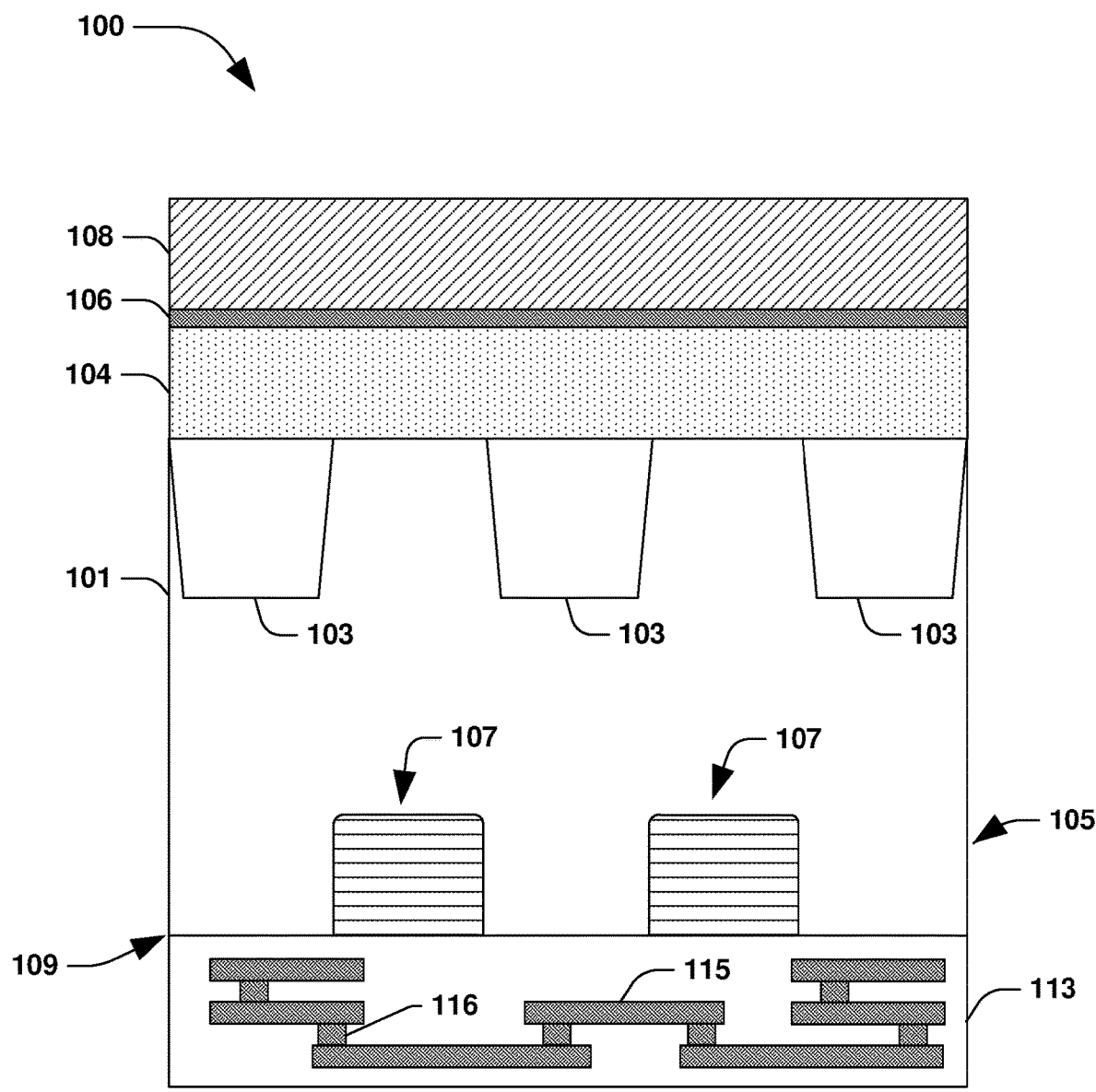
Figure 1E:
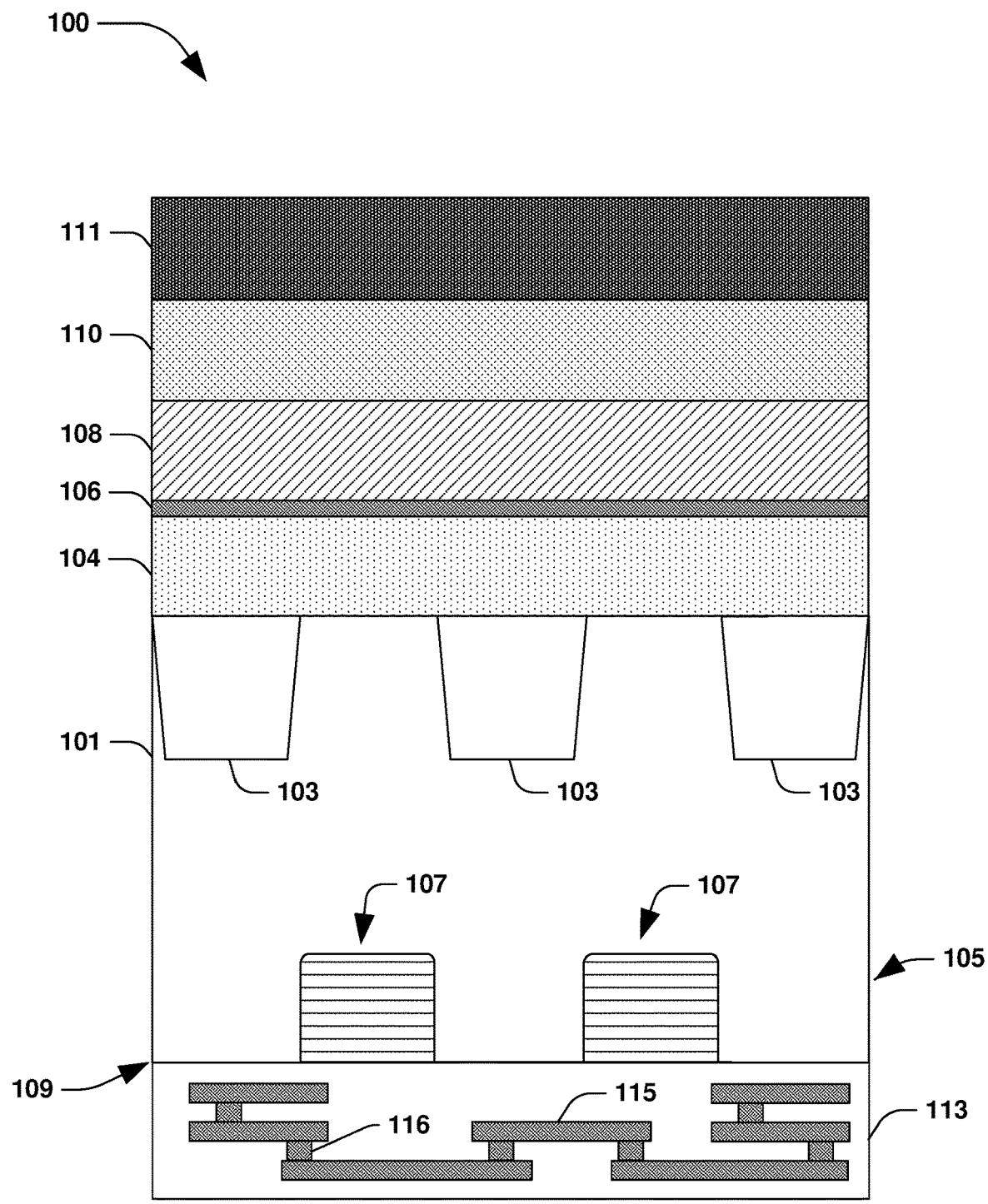

Referring to FIG. 1D, a metal layer 108 is formed over the first barrier layer 106, in accordance with some embodiments. In some embodiments, the metal layer 108 comprises tungsten or other suitable metal material. Referring to FIG. 1E, a second dielectric layer 110 is formed over the metal layer 108, and a third dielectric layer 111 is formed over the second dielectric layer 110, in accordance with some embodiments. In some embodiments, a material composition of the second dielectric layer 110 is different than a material composition of the third dielectric layer 111. In some embodiments, the second dielectric layer 110 comprises $SiO_2$ or a low-k material. In some embodiments, the second dielectric layer 110 has a same material composition as the first dielectric layer 104. In some embodiments, the third dielectric layer 111 comprises a high-k dielectric material. As used herein, the term "high-k dielectric" refers to a material having a dielectric constant, k, greater than or equal to about 3.9, which is the k value of $SiO_2$. The material of the high-k dielectric layer may be any suitable material. Examples of the material of the high-k dielectric layer include but are not limited to $Al_2O_3$, $HfO_2$, $ZrO_2$, $La_2O_3$, $TiO_2$, $SrTiO_3$, $LaAlO_3$, $Y_2O_3$, $Al_2O_xN_y$, $HfO_xN_y$, $ZrO_xN_y$, $La_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3, and each value of y is independently from 0 to 2.

While the example embodiment illustrates two dielectric layers 110, 111 as being formed over the metal layer 108, any number of dielectric layers may be formed over the metal layer 108. For example, in some embodiments the second dielectric layer 110 but not the third dielectric layer 111 is formed over the metal layer 108. Moreover, in some embodiments, neither the second dielectric layer 110 nor the third dielectric layer 111 are formed over the metal layer 108, and thus the process described with respect to FIG. 1E is skipped.

Figure 1F:
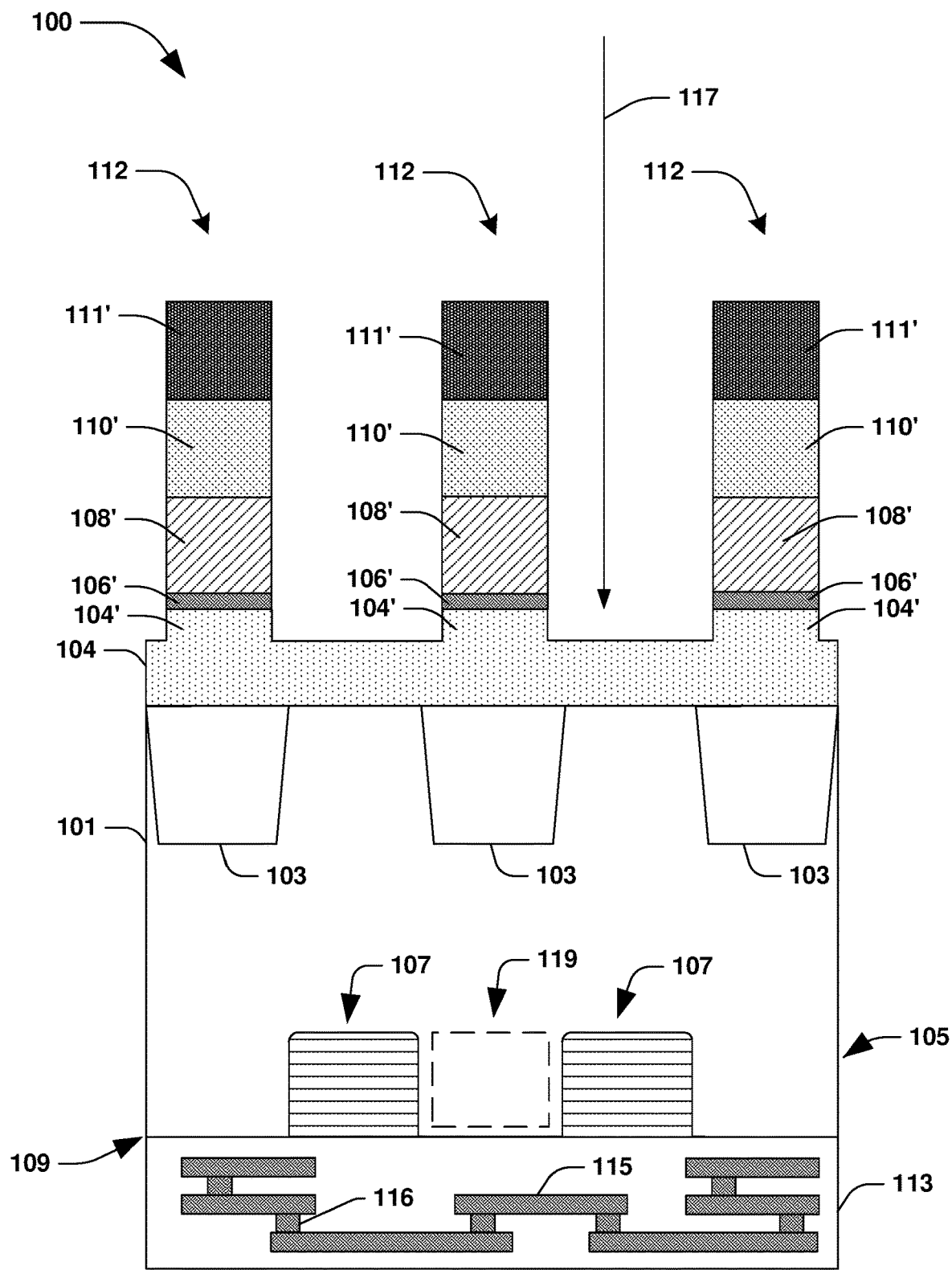

Referring to FIG. 1F, portions of the first dielectric layer 104, the first barrier layer 106, the metal layer 108, the second dielectric layer 110, and the third dielectric layer 111 are removed to define grid structures 112, in accordance with some embodiments. In some embodiments, each of the grid structures 112 comprises at least one of a first dielectric structure 104' defined from the first dielectric layer 104, a first barrier structure 106' defined from the first barrier layer 106, a metal structure 108' defined from the metal layer 108, a second dielectric structure 110' defined from the second dielectric layer 110, or a third dielectric structure 111' defined from the third dielectric layer 111. In some embodiments, each grid structure 112 is disposed between two adjacent pixels such that the first dielectric structure 104', the first barrier structure 106', the metal structure 108', the second dielectric structure 110', and the third dielectric structure 111' of a first grid structure 112 overlie a portion 119 of the substrate 101 between a first pixel 107 and a second pixel 107. In some embodiments, between each grid structure 112 and over each pixel 107 is an optical path 117 through which radiation is guided by adjacent grid structures 112 to a pixel 107 between the adjacent grid structures 112.

In some embodiments, the portions of the first dielectric layer 104, the first barrier layer 106, the metal layer 108, the second dielectric layer 110, and the third dielectric layer 111 are removed by an etching process. In some embodiments, the etching process comprises forming a photoresist layer over the third dielectric layer 111 and patterning the photoresist layer such that some portions of the underlying third dielectric layer 111 are covered by the photoresist layer while other portions of the third dielectric layer 111 are uncovered or are exposed.

In some embodiments, after patterning of the photoresist layer, portions of the third dielectric layer 111 not covered by the photoresist layer are exposed to an etchant, which removes or etches away the portions of the third dielectric layer 111, as well as portions of the second dielectric layer 110, the metal layer 108, the first barrier layer 106, and the first dielectric layer 104 underlying the uncovered portions of the third dielectric layer 111. In some embodiments, depending upon the material composition of the layers 104, 106, 108, 110, and 111 and the etch selectivity of the layers 104, 106, 108, 110, and 111, the etching process may be performed in multiple stages using different etch chemistries or different etching methodologies to remove the portions of the first dielectric layer 104, the first barrier layer 106, the metal layer 108, the second dielectric layer 110, and the third dielectric layer 111.

Figure 6:
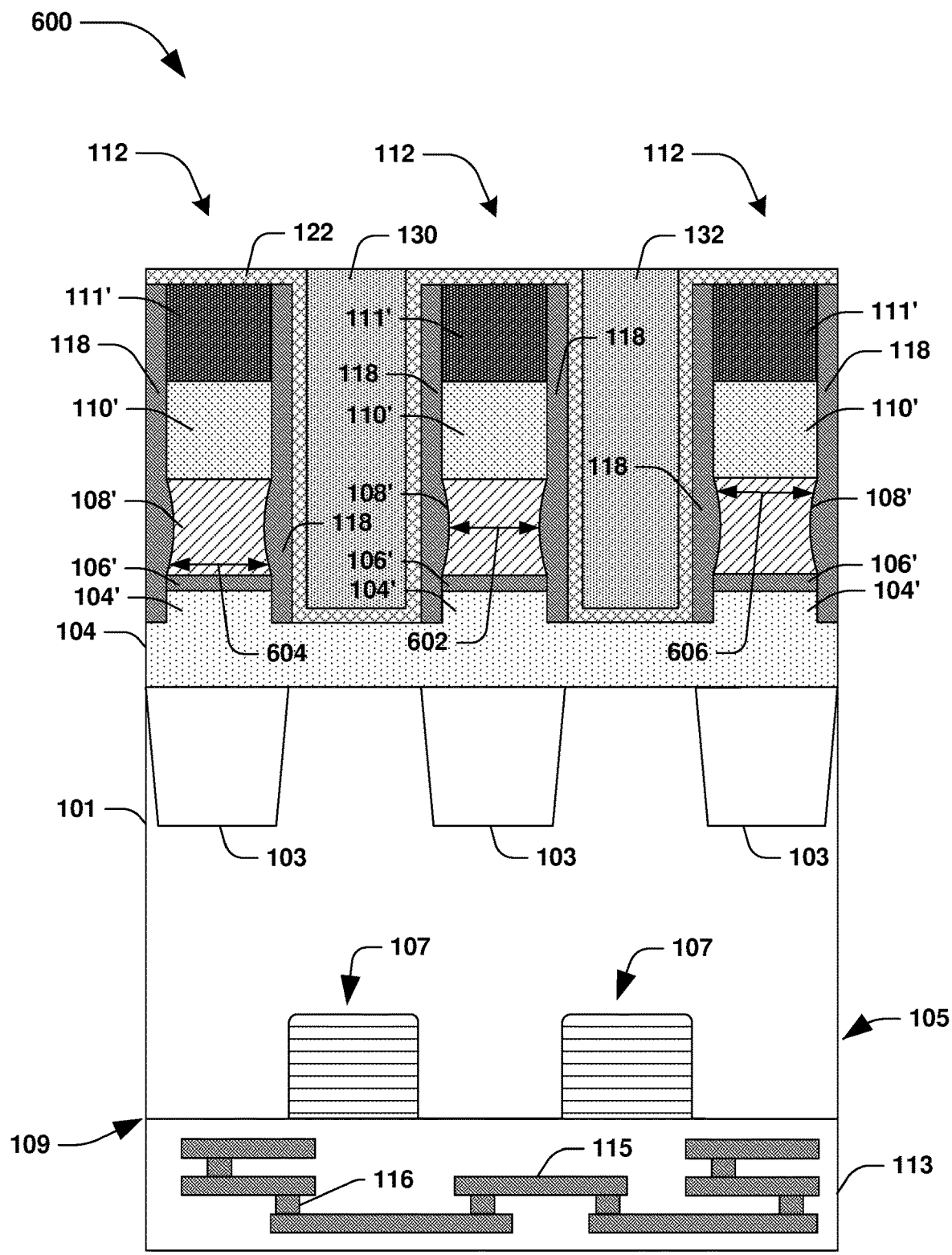
FIG. 6 is an illustration of a cross-sectional view of a semiconductor device, in accordance with some embodiments.
Figure 7:
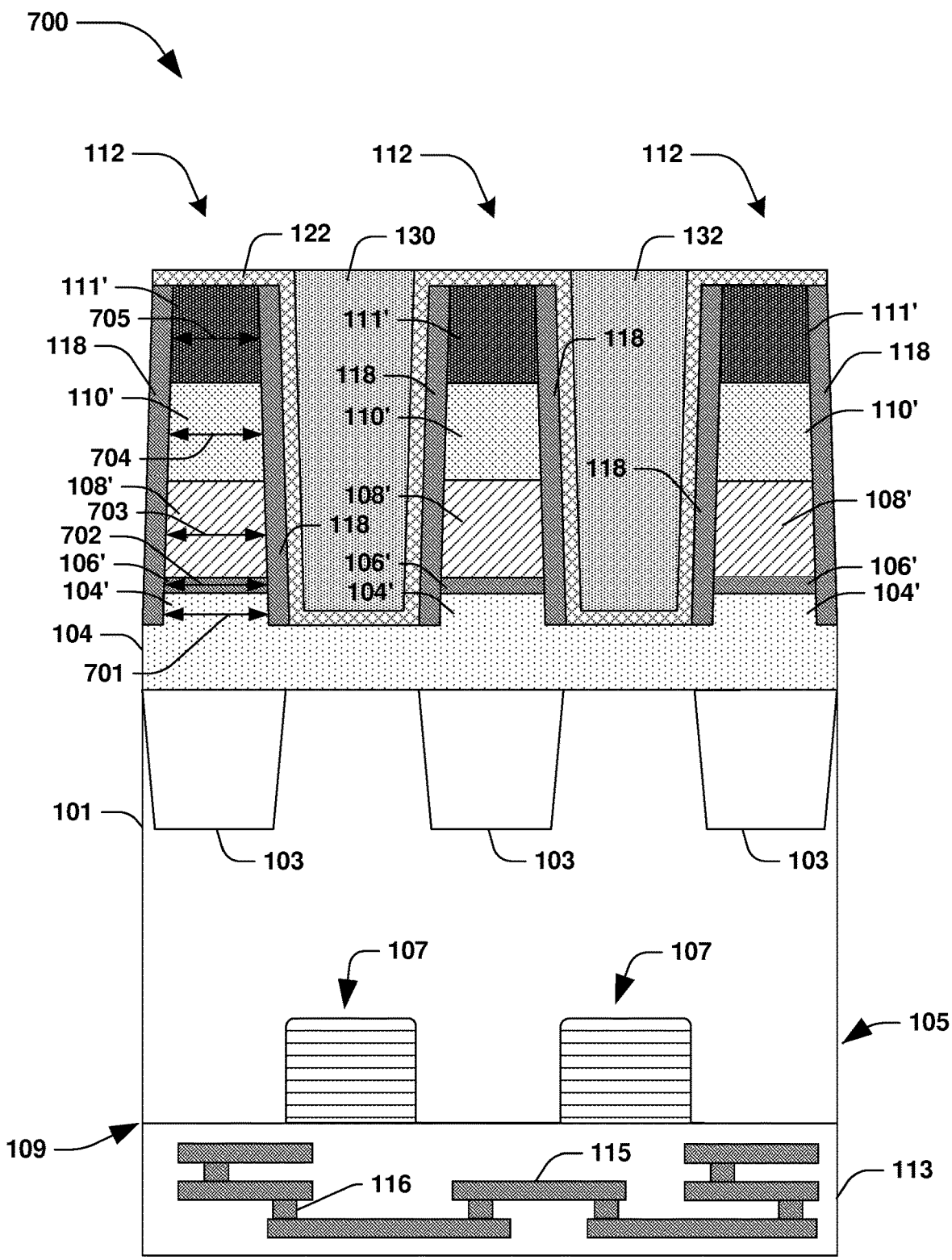
FIG. 7 is an illustration of a cross-sectional view of a semiconductor device, in accordance with some embodiments.

In some embodiments, the sidewalls of the grid structures 112 are vertical or lie in a plane perpendicular to a top surface of the substrate 101. In some embodiments, the sidewalls of the grid structures 112 are tapered (such as illustrated in FIG. 6). In some embodiments, different layers of the grid structures 112 have different sidewall angles, such as where the third dielectric structures 111' have a different sidewall angle than at least one of the second dielectric structures 110', the metal structures 108', the first barrier structures 106', or the first dielectric structures 104'. In some embodiments, at least one layer is necked (such as illustrated in FIG. 7) such that a width of a middle portion of the at least one layer is less than a width of an upper portion of the at least one layer above the middle portion and is less than a width of a lower portion of the at least one layer below the middle portion. In some embodiments, whether the sidewalls of the various layers are vertical, co-planar with each other, are uniformly tapered, are necked, or have various degrees of tapering (resulting in one or more of the structures 104', 106', 108', 110', 111' having different sidewall angles) is a function of how the etching process or processes are performed.

In some embodiments, portions of the substrate 101 overlying the pixels 107 remain covered or concealed by at least a portion of the first dielectric layer 104 after the etching process or processes. Thus, the pixels 107 continue to underlie the first dielectric layer 104 after the grid structures 112 are formed. In some embodiments, the portions of the substrate 101 overlying the pixels 107 are exposed due to the etching process or processes.

Figure 1G:
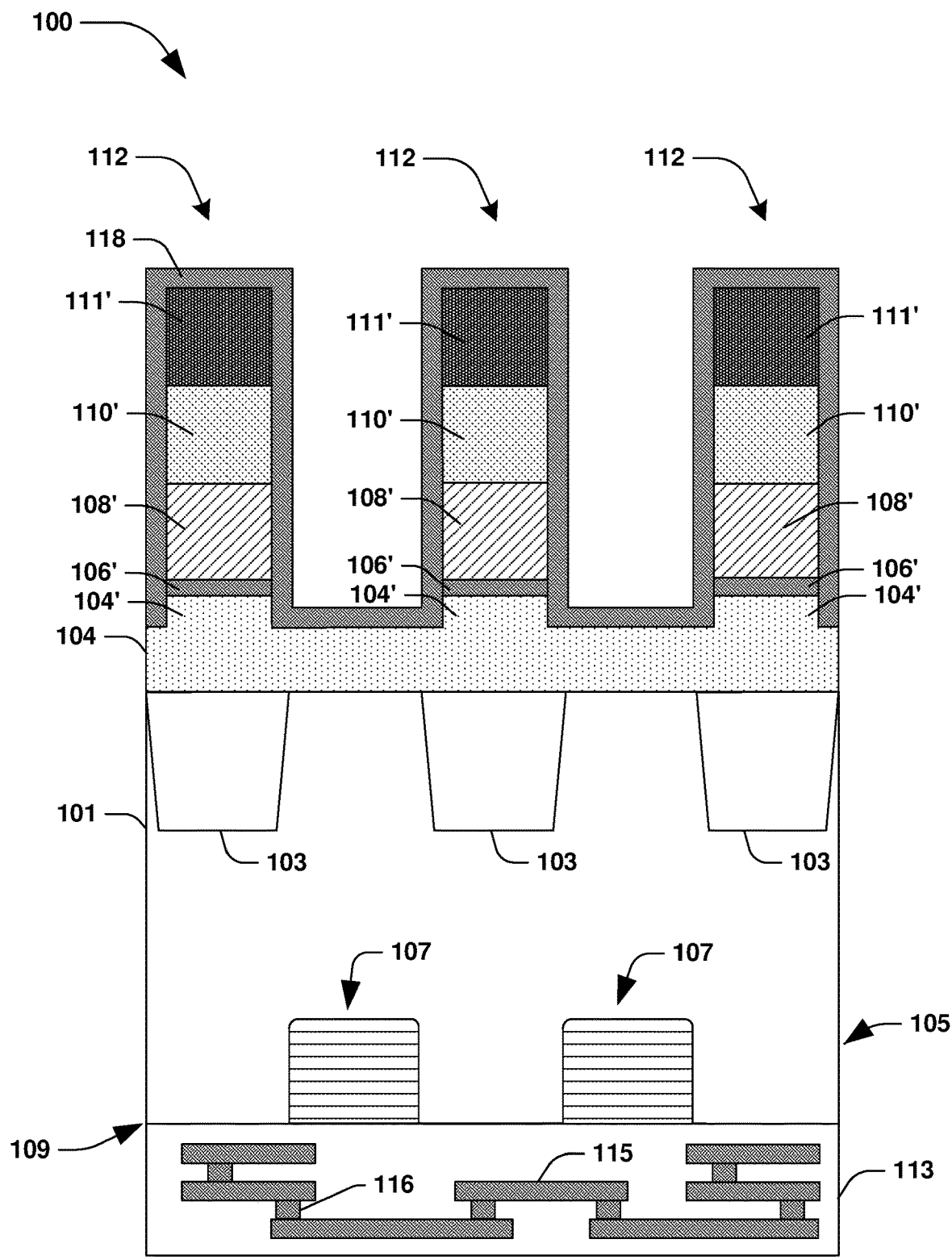
Figure 5:
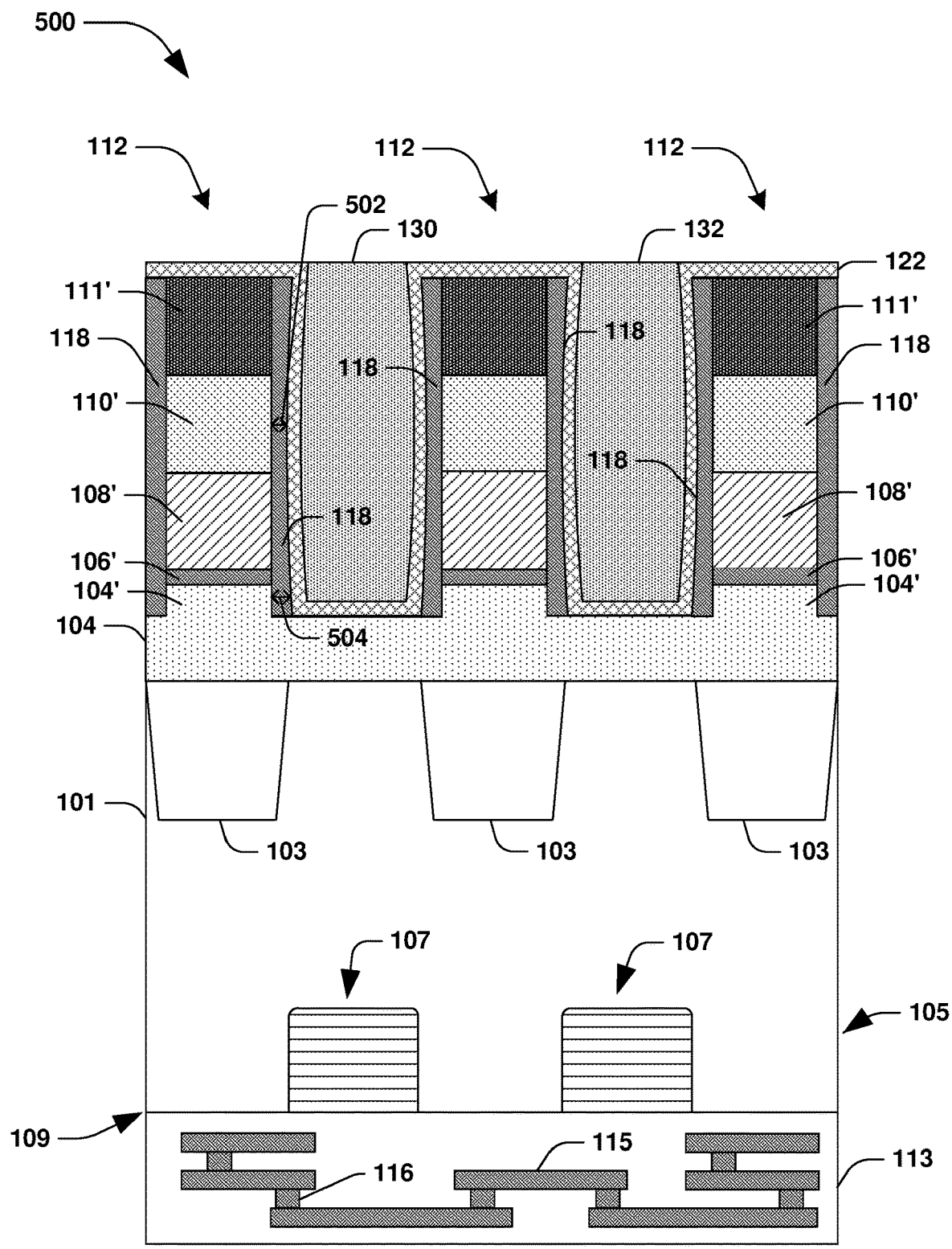
FIG. 5 is an illustration of a cross-sectional view of a semiconductor device, in accordance with some embodiments.

Referring to FIG. 1G, a second barrier layer 118 is formed over the grid structures 112, in accordance with some embodiments. In some embodiments, the second barrier layer 118 is further formed over the first dielectric layer 104. In some embodiments, the second barrier layer 118 is conformally formed over the grid structures 112 and the first dielectric layer 104. In some embodiments, the second barrier layer 118 may be formed in a non-conformal matter. In some embodiments, the second barrier layer 118 contacts sidewalls of at least one of the third dielectric structures 111', the second dielectric structures 110', the metal structures 108', the first barrier structure 106', or the first dielectric structure 104'. In some embodiments, the second barrier layer 208 contacts sidewalls of the first dielectric layer 104, such as sidewalls of the first dielectric structure 104', and a top surface of the first dielectric layer 104. In some embodiments the thickness of the second barrier layer 208 is non-uniform. For example, as illustrated by FIG. 5, widths 502 of the second barrier layer 118 approximate middle sidewall portions of the grid structures 112 are less than widths 504 of the second barrier layer 118 approximate lower sidewall portions of the grid structures 112. In some embodiments, the second barrier layer 118 comprises $SiO_x$, $SiN_x$, $SiC_x$, $TiN_x$, $TaN_x$, $HfO_x$, $TaO_x$, AlOx, or other suitable material. In some embodiments, the second barrier layer 118 has a same material composition as the first barrier layer 106.

In some embodiments, the second barrier layer 118 comprises multiple layers, such as a first layer of TiN to provide isolation for the metal structures 108' and then a second layer of Ti to provide improved adhesion with a subsequently formed passivation layer 122. In some embodiments, the first layer of TiN has a thickness of about 35 angstroms. In some embodiments, the second layer of Ti has a thickness of about 100 angstroms. In some embodiments, the second barrier layer 118 has a thickness between about 10 angstroms and 2,000 angstroms.

In some embodiments where the portions of the substrate 101 overlying the pixels 107 remain concealed by the first dielectric layer 104 after the etching process or processes, the second barrier layer 118 is separated from the portions of the substrate 101 overlying the pixels 107, and thereby separated from the pixels 107, by the first dielectric layer 104. In some embodiments where the portions of the substrate 101 overlying the pixels 107 are exposed after the etching process or processes, the second barrier layer 118 may contact the portions of the substrate 101 overlying the pixels 107.

Figure 1H:
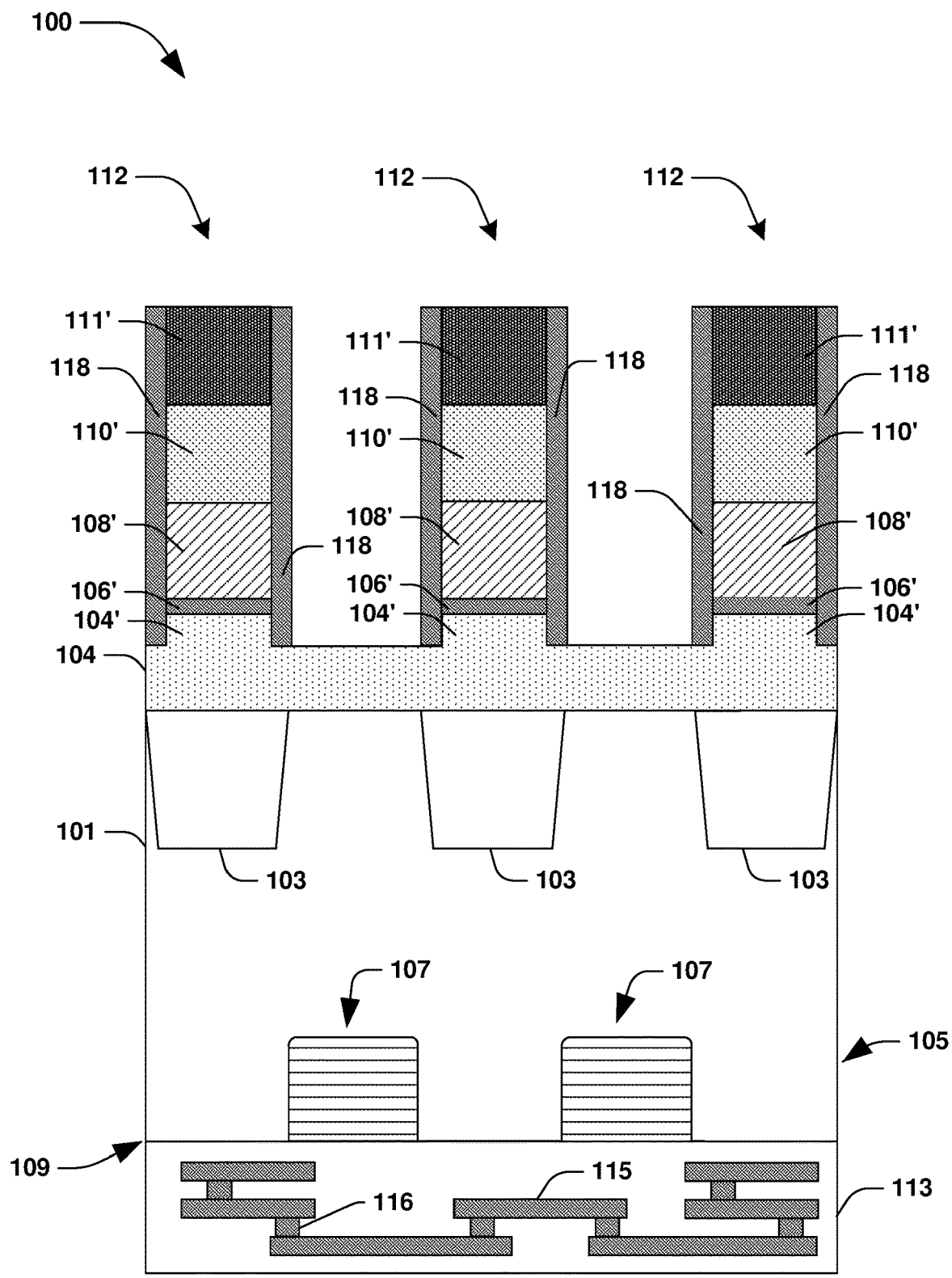

Referring to FIG. 1H, a portion of the second barrier layer 118 is removed, in accordance with some embodiments. In some embodiments, a portion of the second barrier layer 118 overlying the first dielectric layer 104 and between the grid structures 112 is removed by an etching process. In some embodiments where the portions of the substrate 101 overlying the pixels 107 are covered by the first dielectric layer 104, the removal of the portion of the second barrier layer 118 exposes the first dielectric layer 104. In some embodiments where the portions of the substrate 101 overlying the pixels 107 are not covered by the first dielectric layer 104, the removal of the portion of the second barrier layer 118 exposes the portions of the substrate 101 overlying the pixels 107. In some embodiments, a portion of the second barrier layer 118 overlying the third dielectric layer 111 is also removed by the etching process. In some embodiments, the second etching process is a blanket etching process that does not utilize a photoresist mask.

Figure 1I:
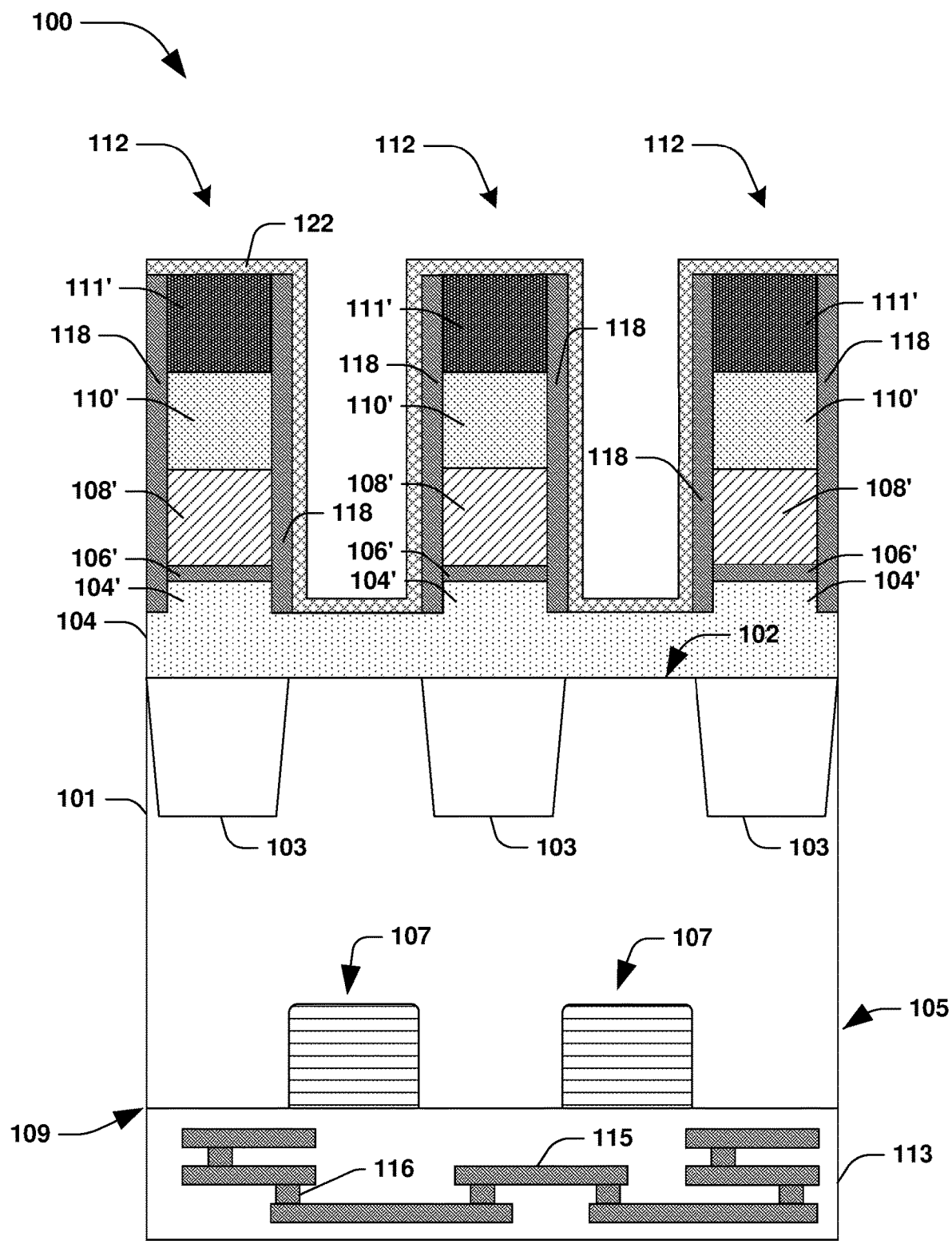

Referring to FIG. 1I, the passivation layer 122 is formed over the grid structures 112, in accordance with some embodiments. In some embodiments where the portions of the substrate 101 overlying the pixels 107 are covered by the first dielectric layer 104, the passivation layer 122 is formed over the first dielectric layer 104. In some embodiments where the portions of the substrate 101 overlying the pixels 107 are covered by the first dielectric layer 104, the passivation layer 122 contacts a top surface the first dielectric layer 104. In some embodiments where the portions of the substrate 101 overlying the pixels 107 are not covered by the first dielectric layer 104, the passivation layer 122 contacts the back side 102 of the portions of the substrate 101 overlying the pixels 107. In some embodiments, the passivation layer 122 contacts a sidewall of the second barrier layer 118.

In some embodiments, the passivation layer 122 is formed using a conformal deposition process to deposit material have a different material composition than the material composition of the second barrier layer 118. In some embodiments, the passivation layer 122 has a thickness between about 10 angstroms and about 2,000 angstroms. In some embodiments, the passivation layer 122 comprises a material that is substantially optically transparent to the wavelengths of radiation intended to be received by the pixels 107.

Figure 1J:
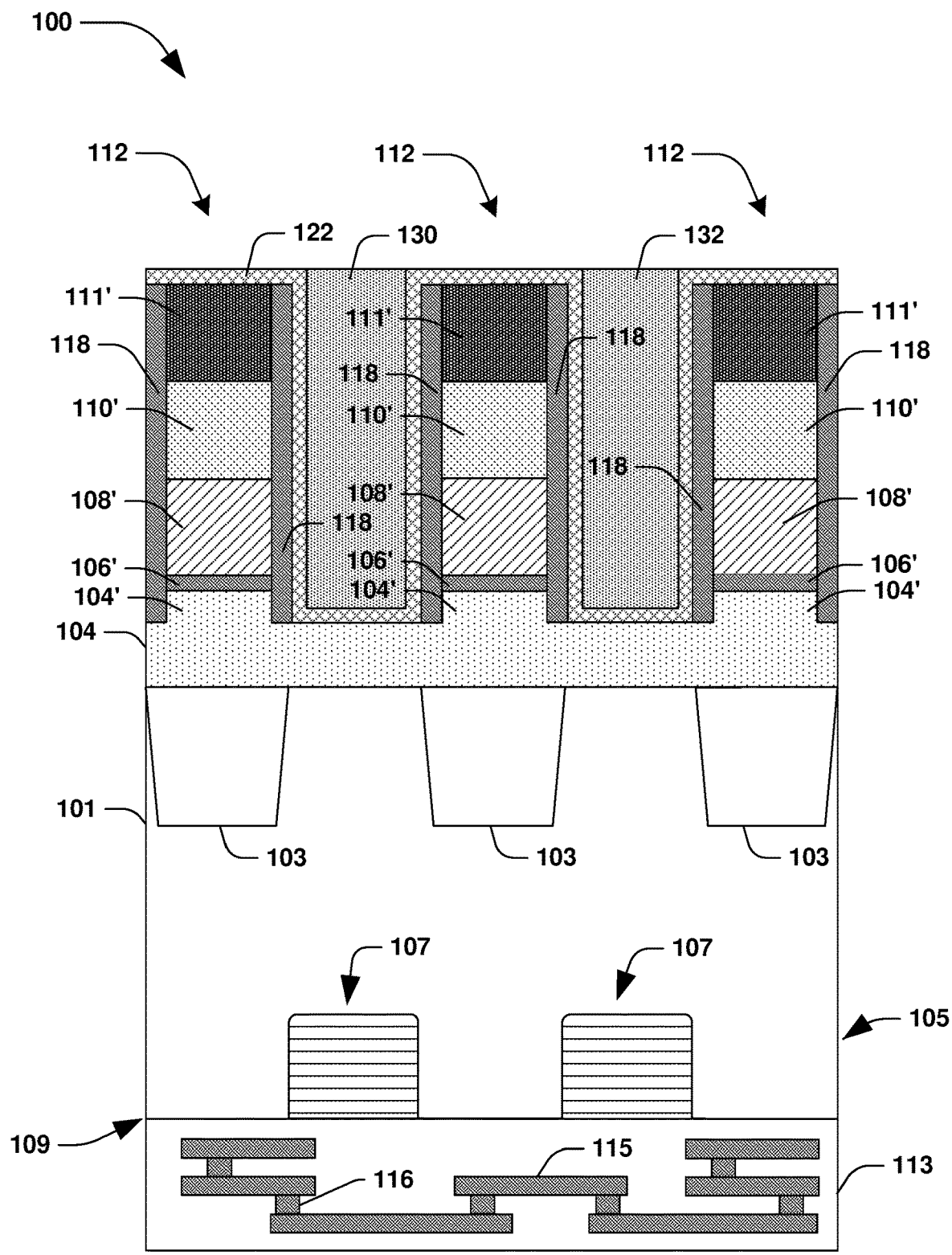

Referring to FIG. 1J, color filter materials 130, 132 are formed within the optical paths 117 between the grid structures 112, in accordance with some embodiments. In some embodiments, a first color filter material 130 is deposited between a first pair of adjacent grid structures 112 and overlying a first pixel 107 in order to filter certain wavelengths (colors) of radiation channeled through the first color filter material 130 to the first pixel 107. In some embodiments, a second color filter material 132 is deposited between a second pair of adjacent grid structures 112 and overlying a second pixel 107 in order to filter certain wavelengths (colors) of radiation channeled through the second color filter material 132 to the second pixel 107. In some embodiments, the first color filter material 130 and the second color filter material 132 have different material compositions to enable different wavelengths to be filtered. In some embodiments, the passivation layer 122 is disposed between the color filter materials 130, 132 and the first dielectric layer 104 or between the color filter materials 130, 132 and the portions of the substrate 101 overlying the pixels 107.

In some embodiments, the second barrier layer 118 provides isolation between the metal structures 108' and the passivation layer 122. In some embodiments, the second barrier layer 118 provides improved adhesion to the passivation layer 122 relative to a structure in which the second barrier layer 118 is not provided. In some embodiments, by providing isolation and adhesion, diffusion of the metal structures 108' through the passivation layer 122 is mitigated, thereby mitigating the possibility of the metal structures 108' causing interference in the optical paths 117.

FIGS. 2A-2I are cross-sectional views of a semiconductor device 200 formed with a second barrier layer 208, in accordance with some embodiments. In some embodiments, the semiconductor device 200 comprises a CMOS image sensor, such as a backside illumination CMOS image sensor.

Figure 2A:
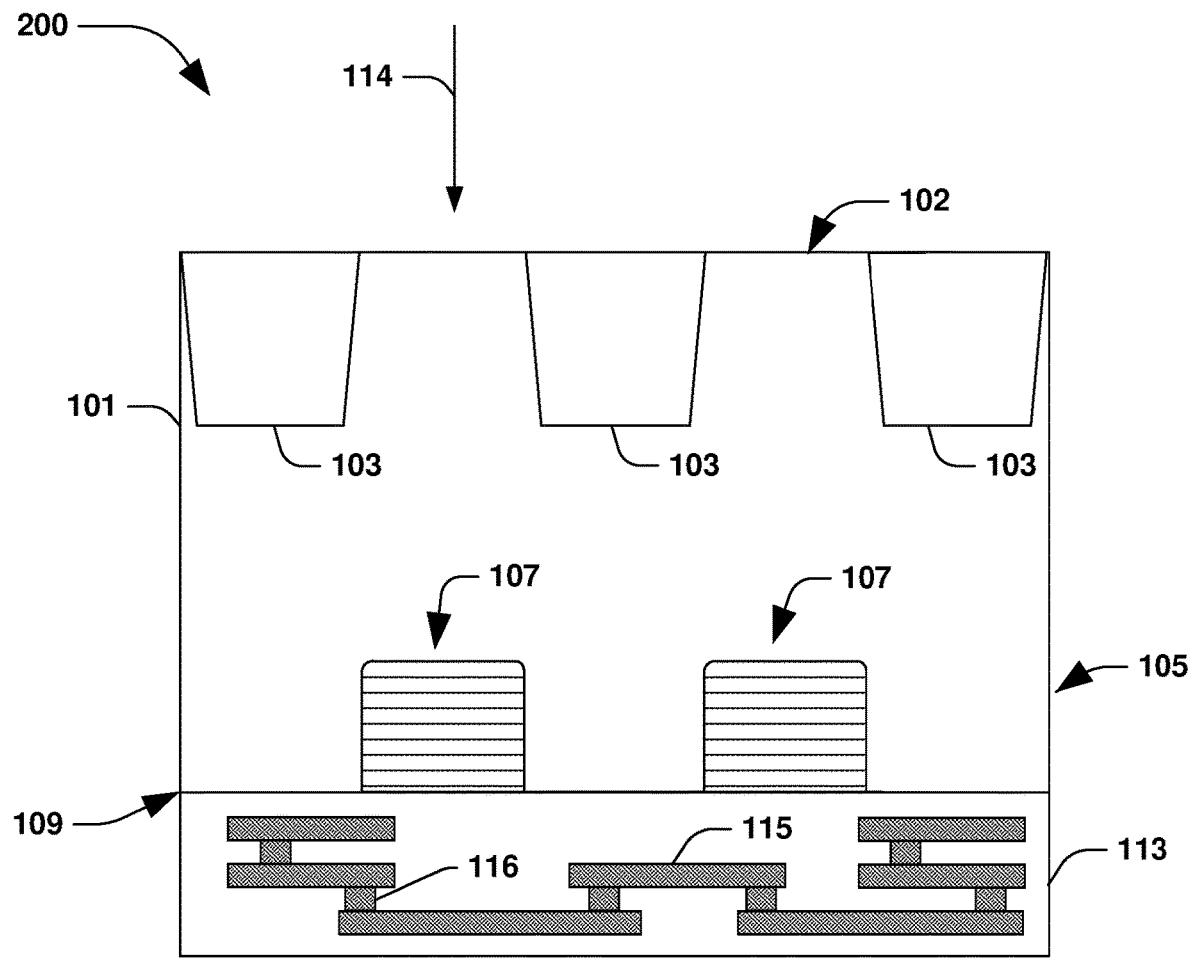
FIG. 2A-2I are illustrations of cross-sectional views of a semiconductor device at various stages of fabrication, in accordance with some embodiments.

Referring to FIG. 2A, a substrate 101 comprising a pixel array 105 is provided, according to some embodiments. The substrate 101 has a front side 109 and a back side 102. The pixel array 105 comprises a plurality of pixels 107, such as photodiodes, phototransistors, etc., that are formed within the substrate 101. In some embodiments, the pixels 107 are configured to sense radiation, such as incident light, which is projected towards the substrate 101 from the back side 102. Radiation entering the substrate 101 through the back side 102 is detected by one or more of the pixels 107. In some embodiments, the pixels 107 comprise pinned layer photodiodes, photogates, reset transistors, source follower transistors, transfer transistors, etc. The pixels 107 can vary from one another to have different junction depths, thicknesses, widths, and so forth. Even though 2 pixels are depicted, any number of pixels can be formed within the substrate 101. In some embodiments, isolation regions 103, such as backside isolation regions, are disposed between the pixels 107, such that the isolation regions 103 are offset from the pixels 107 in a direction perpendicular to a direction 114 that the radiation travels to enter the substrate 101 and be detected by the pixels 107. In some embodiments, the isolation regions 103 are shallow trench isolation (STI) structures.

An interconnect structure 113 is formed over the front side 109 of the substrate 101, according to some embodiments. In some embodiments, the interconnect structure 113 comprises a plurality of patterned dielectric layers and conductive layers that provide interconnections, such as wiring, between various doped features, circuitry, and input/output of the semiconductor device 100. In some embodiments, the interconnect structure 113 comprises an interlayer dielectric and multilayer interconnect structures, such as contacts, vias, metal lines, etc. For purposes of illustration, the interconnect structure 113 comprises conductive lines 115 and vias/contacts 116 illustrated in FIG. 2A that are merely exemplary, and the actual positioning and configuration can vary depending upon design needs.

Figure 2B:
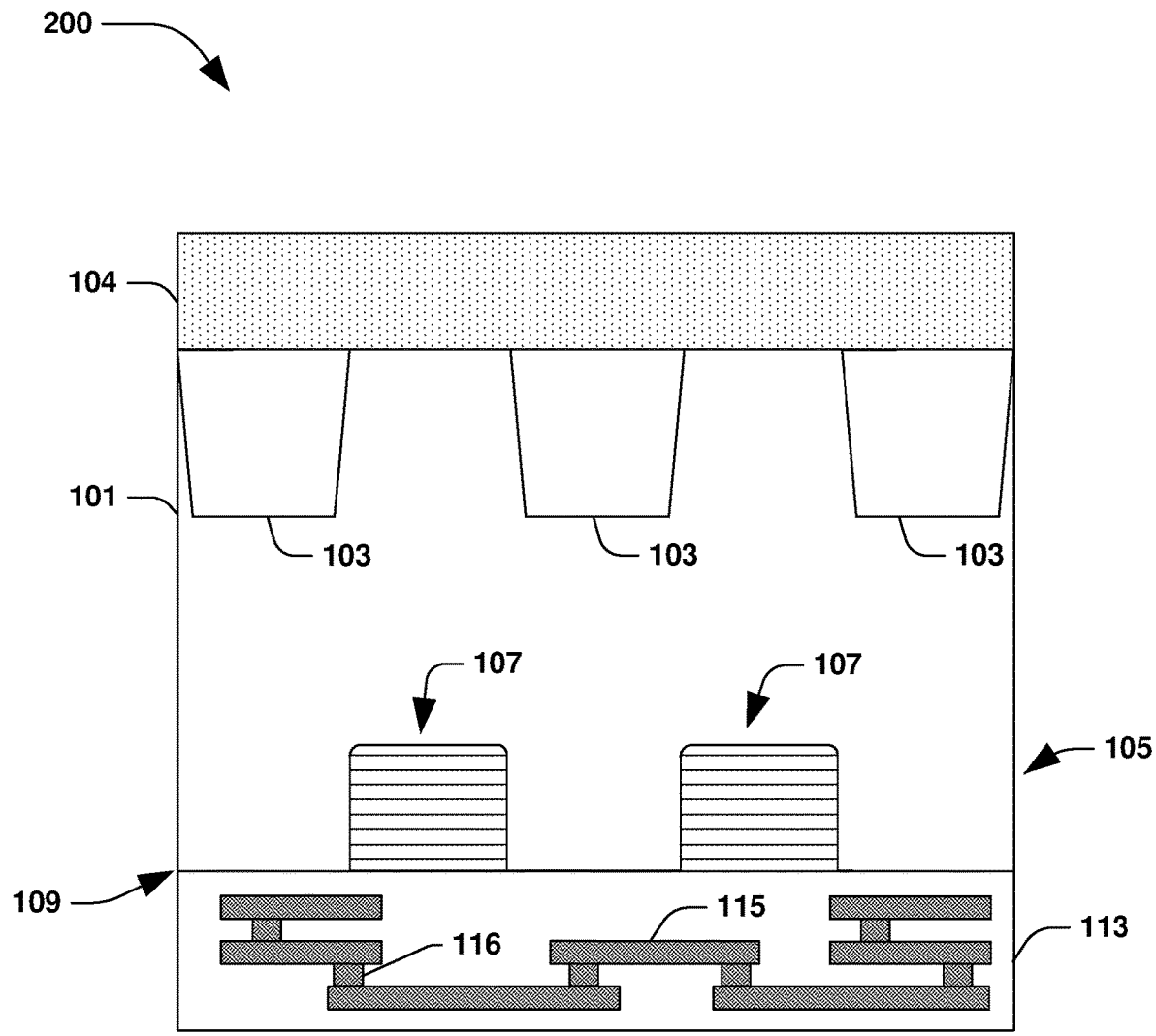

FIGS. 2B-2I are cross-sectional views of a grid array being formed over the substrate 101. Referring to FIG. 2B, a first dielectric layer 104 is formed over the substrate 101, in accordance with some embodiments. In some embodiments, the first dielectric layer 104 comprises a material that is substantially optically transparent to the wavelengths of radiation intended to be received by the pixels 107. In some embodiments, the first dielectric layer 104 comprises $SiO_2$ or a low-k material.

Figure 2C:
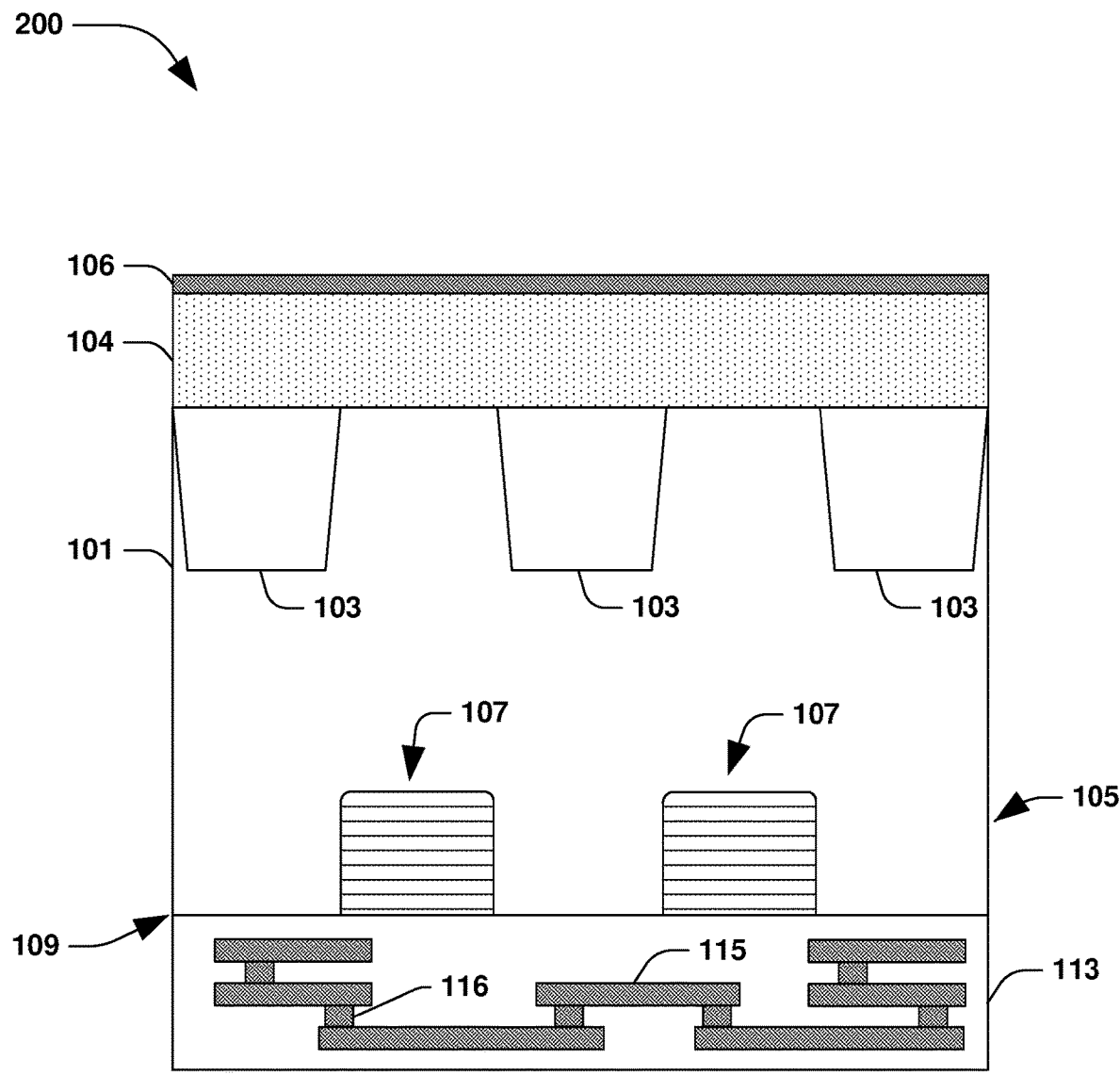

Referring to FIG. 2C, a first barrier layer 106 is formed over the first dielectric layer 104, in accordance with some embodiments. In some embodiments, the first barrier layer 106 comprises a metal material. Examples of the metal material include but are not limited to W, Cu, Al, Co, Ni, Ti, Ta, alloys thereof, or other suitable metal material. In some embodiments, the first barrier layer 106 comprises a dielectric material. Examples of the dielectric material include but are not limited to $SiO_x$, $SiN_x$, $SiC_x$, $TiN_x$, $TaN_x$, $HfO_x$, $TaO_x$, $AlO_x$, or other suitable dielectric material, where x is a value greater than or equal to 1. In some embodiments, the first barrier layer 106 comprises a single layer of material. In some embodiments, the first barrier layer 106 comprises multiple layers of material. For example, the first barrier layer 106 may comprise a layer of $SiN_x$, a layer of $SiO_x$, and another layer of $SiN_x$.

Figure 2D:
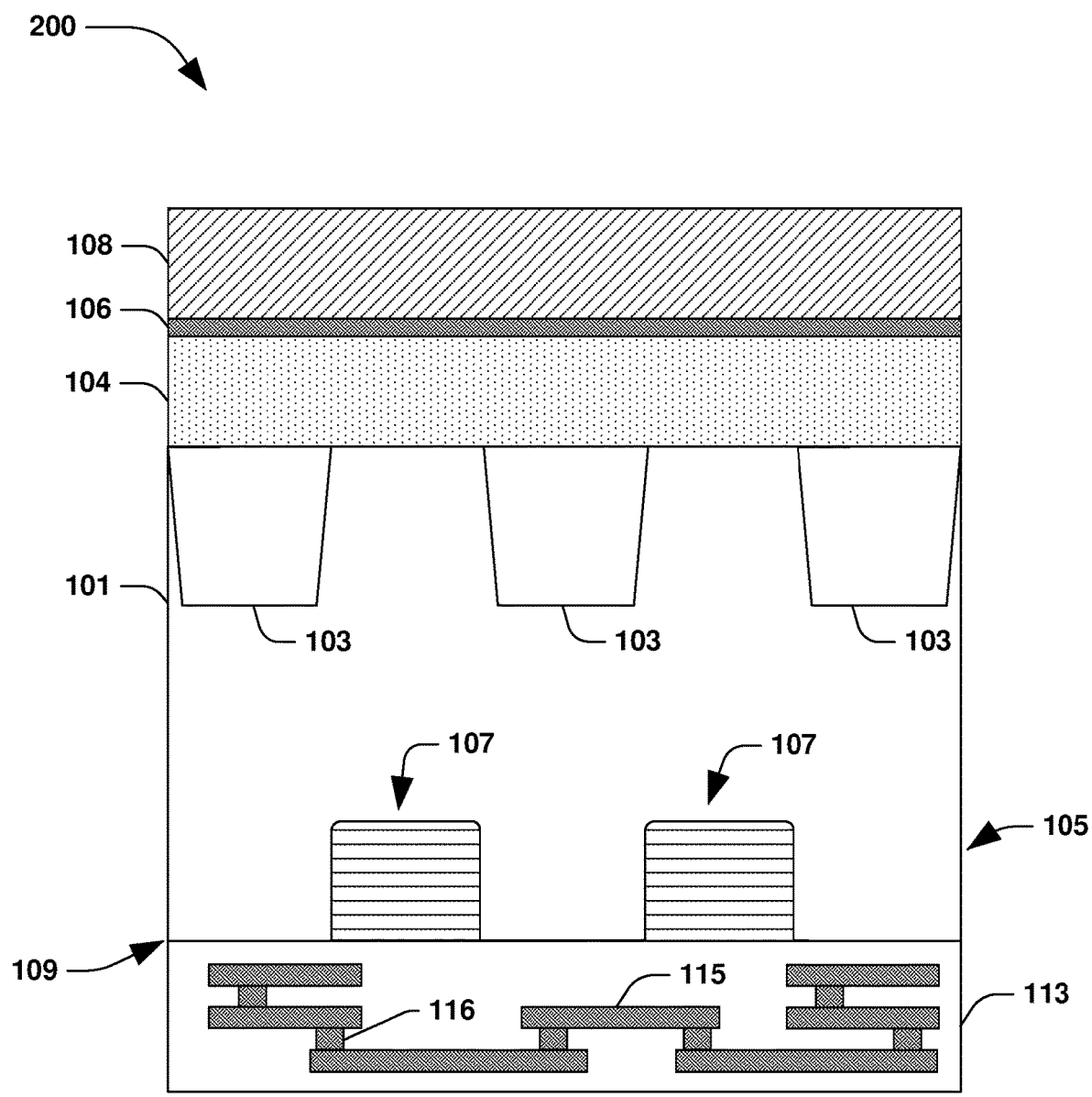
Figure 2E:
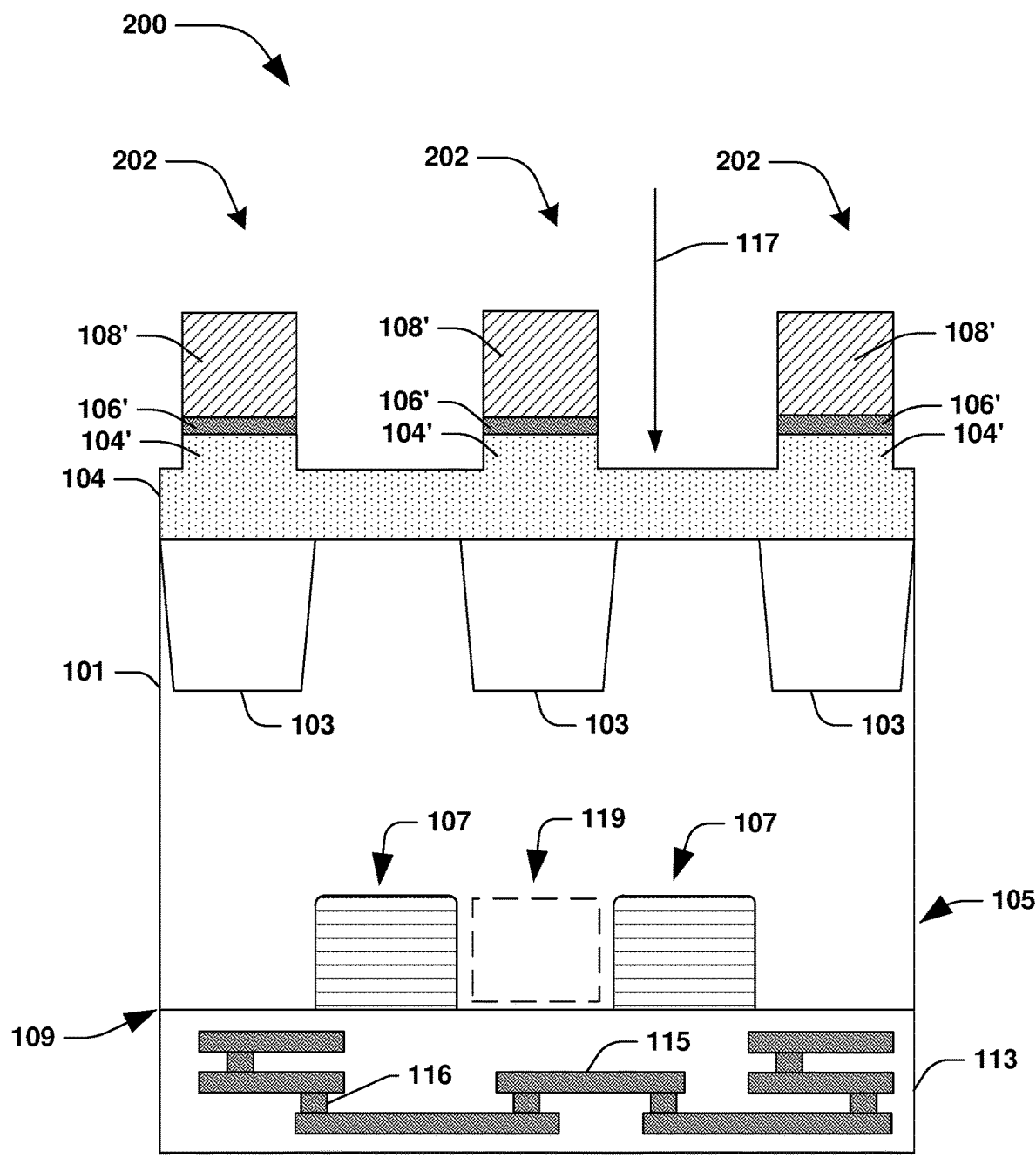

Referring to FIG. 2D, a metal layer 108 is formed over the first barrier layer 106, in accordance with some embodiments. In some embodiments, the metal layer 108 comprises tungsten or other suitable metal material. Referring to FIG. 2E, portions of the first dielectric layer 104, the first barrier layer 106, and the metal layer 108 are removed to define grid structures 202, in accordance with some embodiments. In some embodiments, each of the grid structures 202 comprise at least one of a first dielectric structure 104' defined from the first dielectric layer 104, a first barrier structure 106' defined from the first barrier layer 106, and a metal structure 108' defined from the metal layer 108. In some embodiments, each grid structure 202 is disposed between two adjacent pixels such that the first dielectric structure 104', the first barrier structure 106', and the metal structure 108' of a first grid structure 112 overlie a portion 119 of the substrate 101 between a first pixel 107 and a second pixel 107. In some embodiments, between each grid structure 202 and over each pixel 107 is an optical path 117 through which radiation is guided by adjacent grid structures 202 to a pixel 107 between the adjacent grid structures 202. In some embodiments, the etching process comprises a photolithography and etching process to define the grid structures 202.

In some embodiments, the portions of the first dielectric layer 104, the first barrier layer 106, and the metal layer 108 are removed by an etching process. In some embodiments, the etching process comprises forming a photoresist layer over the metal layer 108 and patterning the photoresist layer such that some portions of the underlying metal layer 108 are covered by the photoresist layer while other portions of the metal layer 108 are uncovered or are exposed.

In some embodiments, after patterning of the photoresist layer, portions of the metal layer 108 not covered by the photoresist layer are exposed to an etchant, which removes or etches away the portions of the metal layer 108, as well as portions of the first barrier layer 106 and the first dielectric layer 104 underlying the uncovered portions of the metal layer 108. In some embodiments, depending upon the material composition of the layers 104, 106, and 108 and the etch selectivity of the layers 104, 106, and 108, the etching process may be performed in multiple stages using different etch chemistries or different etching methodologies to remove the portions of the first dielectric layer 104, the first barrier layer 106, and the metal layer 108.

In some embodiments, the sidewalls of the grid structures 202 are vertical or lie in a plane perpendicular to a top surface of the substrate 101. In some embodiments, the sidewalls of the grid structures 202 are tapered (such as illustrated in FIG. 6). In some embodiments, different layers of the grid structures 202 have different sidewall angles, such as where the metal structures 108' have a different sidewall angle than at least one of the first barrier structures 106' or the first dielectric structures 104'. In some embodiments, at least one layer is necked (such as illustrated in FIG. 7) such that a width of a middle portion of the at least one layer is less than a width of an upper portion of the at least one layer above the middle portion and is less than a width of a lower portion of the at least one layer below the middle portion. In some embodiments, whether the sidewalls of the various layers are vertical, co-planar with each other, are uniformly tapered, are necked, or have various degrees of tapering (resulting in one or more of the structures 104', 106', 108' having different sidewall angles) is a function of how the etching process or processes are performed.

In some embodiments, portions of the substrate 101 overlying the pixels 107 remain covered or concealed by at least a portion of the first dielectric layer 104 after the etching process or processes. Thus, the pixels 107 continue to underlie the first dielectric layer 104 after the grid structures 202 are formed. In some embodiments, the portions of the substrate 101 overlying the pixels 107 are exposed due to the etching process or processes.

Figure 2F:
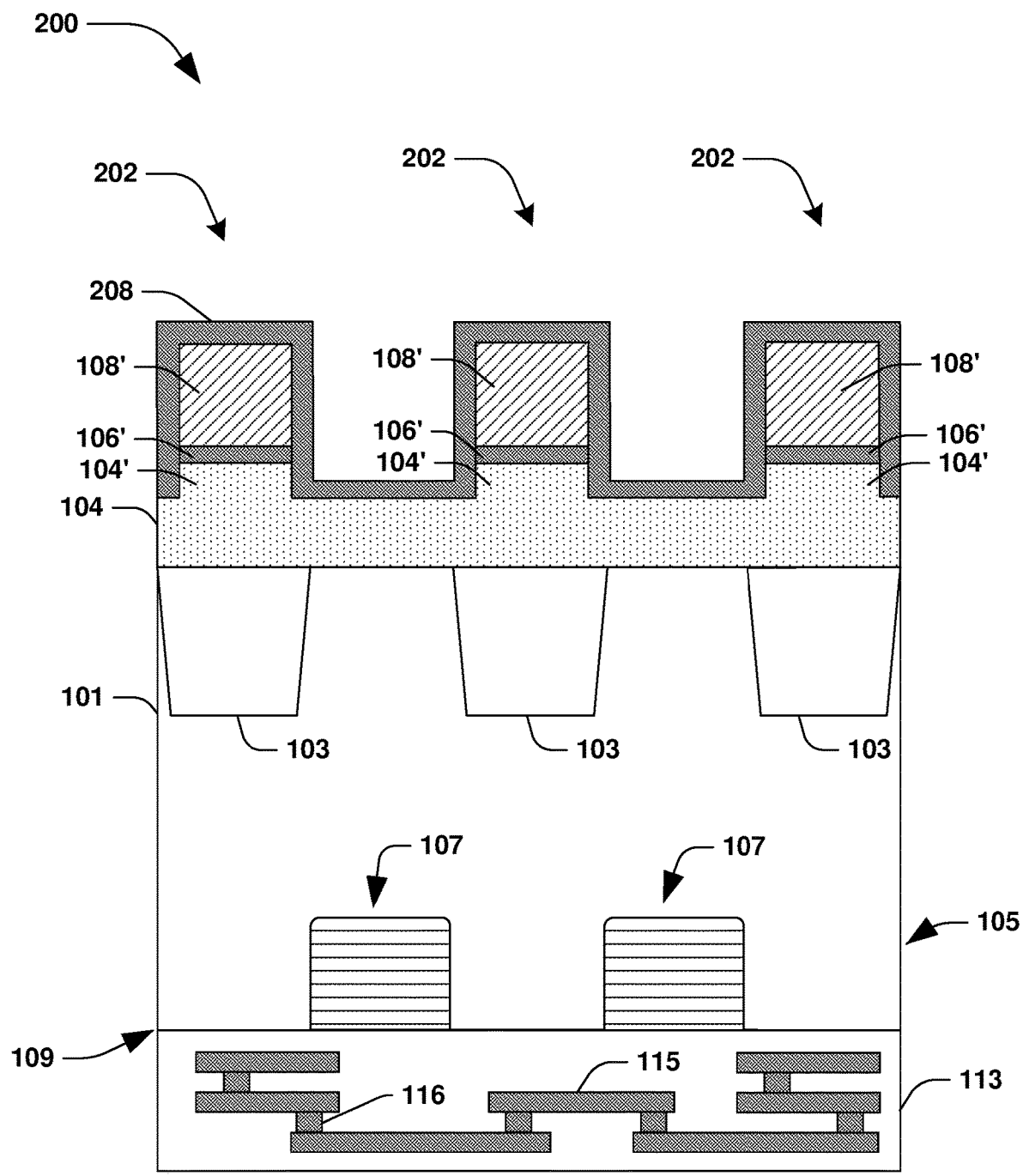

Referring to FIG. 2F, the second barrier layer 208 is formed over the grid structures 202, in accordance with some embodiments. In some embodiments, the second barrier layer 208 is further formed over the first dielectric layer 104. In some embodiments, the second barrier layer 208 is conformally formed over the grid structures 202 and the first dielectric layer 104. In some embodiments, the second barrier layer 208 may be formed in a non-conformal matter. In some embodiments, the second barrier layer 208 contacts sidewalls of the metal structures 108'. In some embodiments, the second barrier layer 208 contacts sidewalls of the first dielectric layer 104, such as sidewalls of the first dielectric structure 104', and a top surface of the first dielectric layer 104. In some embodiments, the second barrier layer 208 comprises $SiO_x$, $SiN_x$, $SiC_x$, $TiN_x$, $TaN_x$, $HfO_x$, $TaO_x$, AlOx, or other suitable material. In some embodiments, the second barrier layer 208 has a same material composition as the first barrier layer 106.

In some embodiments, the second barrier layer 208 comprises multiple layers, such as a first layer of TiN to provide isolation for the metal structures 108' and then a second layer of Ti to provide improved adhesion with a subsequently formed passivation layer 216. In some embodiments, the first layer of TiN has a thickness of about 35 angstroms. In some embodiments, the second layer of Ti has a thickness of about 100 angstroms. In some embodiments, the second barrier layer 208 has a thickness between about 10 angstroms and 2,000 angstroms.

In some embodiments where the portions of the substrate 101 overlying the pixels 107 remain concealed by the first dielectric layer 104 after the etching process or processes, the second barrier layer 208 is separated from the portions of the substrate 101 overlying the pixels 107 by the first dielectric layer 104. In some embodiments where the portions of the substrate 101 overlying the pixels 107 are exposed after the etching process or processes, the second barrier layer 208 may contact the portions of the substrate 101 overlying the pixels 107.

Figure 2G:
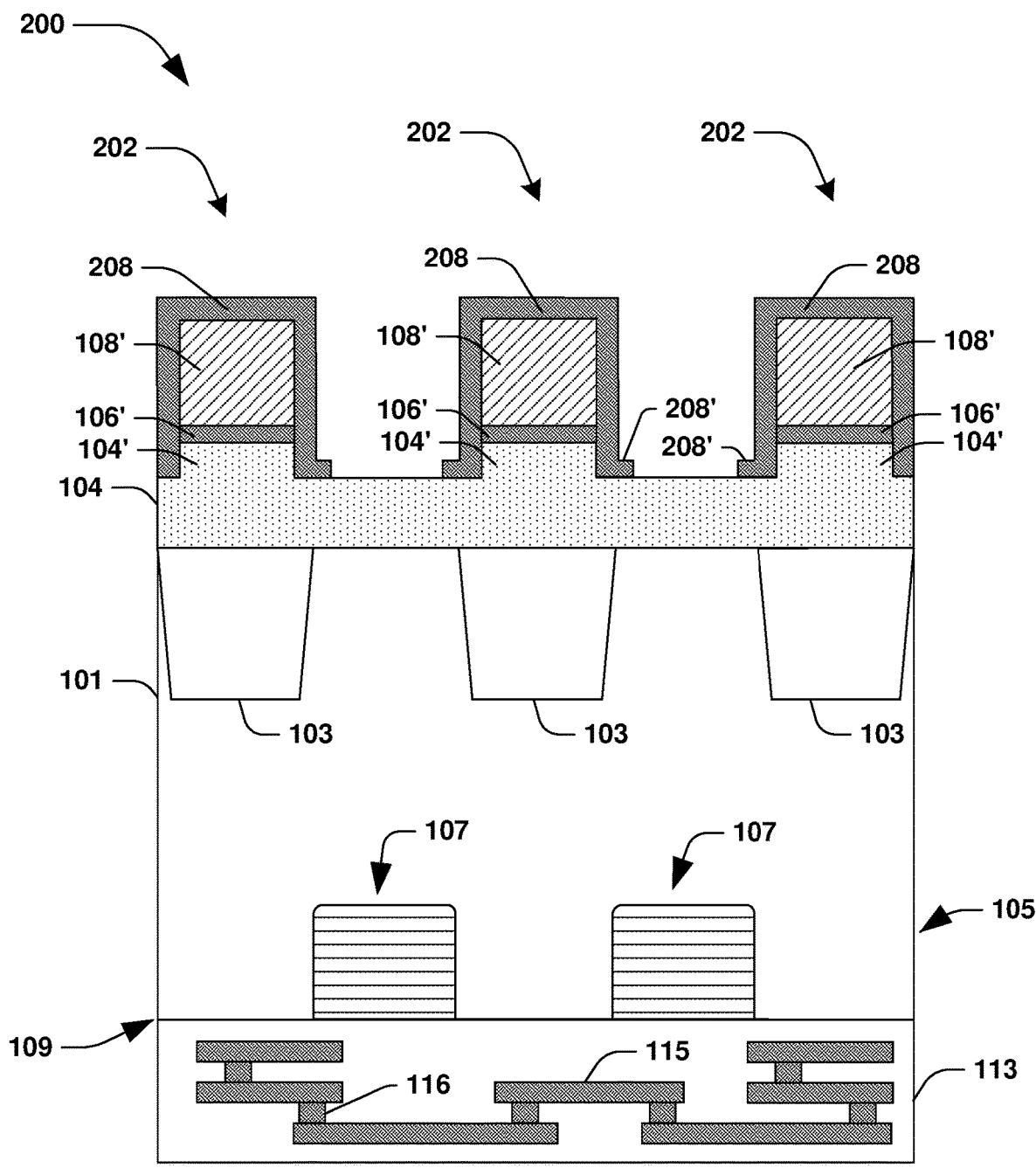

Referring to FIG. 2G, a portion of the second barrier layer 208 is removed, in accordance with some embodiments. In some embodiments, a portion of the second barrier layer 208 overlying the first dielectric layer 104 and between the grid structures 202 is removed by an etching process. In some embodiments where the portions of the substrate 101 overlying the pixels 107 are covered by the first dielectric layer 104, the removal of the portion of the second barrier layer 208 exposes the first dielectric layer 104. In some embodiments where the portions of the substrate 101 overlying the pixels 107 are not covered by the first dielectric layer 104, the removal of the portion of the second barrier layer 208 exposes the portions of the substrate 101 overlying the pixels 107. In some embodiments, the etching process utilizes a photoresist mask to protect a portion of the second barrier layer 208 overlying the metal structures 108' from being etched by the etching process. In some embodiments, due to using the photoresist mask for the etching process, portions 208' of the second barrier layer 208 overlie the pixels 107.

Figure 2H:
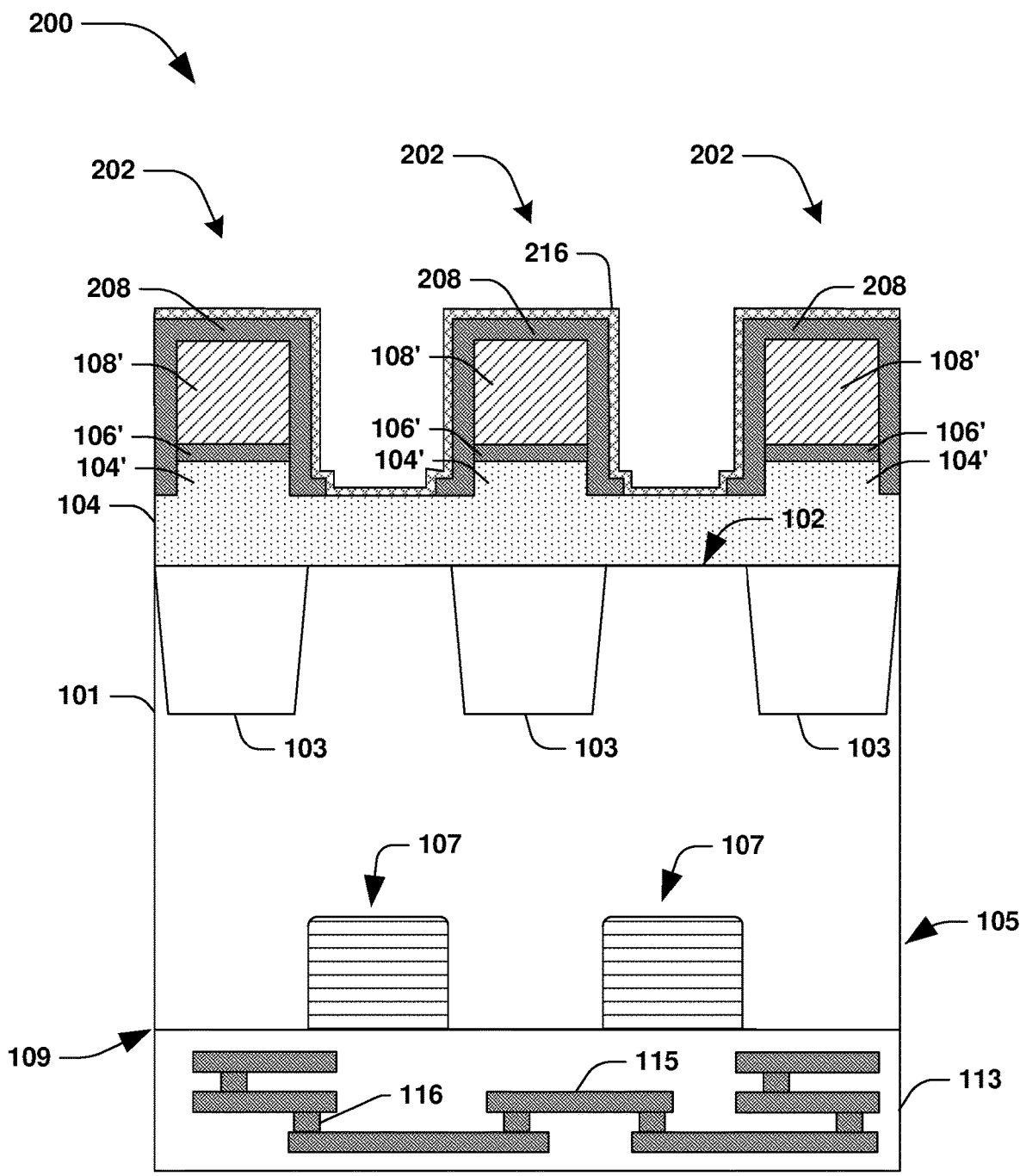

Referring to FIG. 2H, a passivation layer 216 is formed over the grid structures 202, in accordance with some embodiments. In some embodiments where the portions of the substrate 101 overlying the pixels 107 are covered by the first dielectric layer 104, the passivation layer 216 is formed over the first dielectric layer 104. In some embodiments where the portions of the substrate 101 overlying the pixels 107 are covered by the first dielectric layer 104, the passivation layer 216 contacts a top surface the first dielectric layer 104. In some embodiments where the portions of the substrate 101 overlying the pixels 107 are not covered by the first dielectric layer 104, the passivation layer 216 contacts the back side 102 of the portions of the substrate 101 overlying the pixels 107. In some embodiments, the passivation layer 216 contacts a sidewall and a top surface of the second barrier layer 208.

In some embodiments, the passivation layer 216 is formed using a conformal deposition process to deposit material have a different material composition than the material composition of the second barrier layer 208. In some embodiments, the passivation layer 216 has a thickness between about 10 angstroms and about 2,000 angstroms. In some embodiments, the passivation layer 216 comprises a material that is substantially optically transparent to the wavelengths of radiation intended to be received by the pixels 107.

Figure 2I:
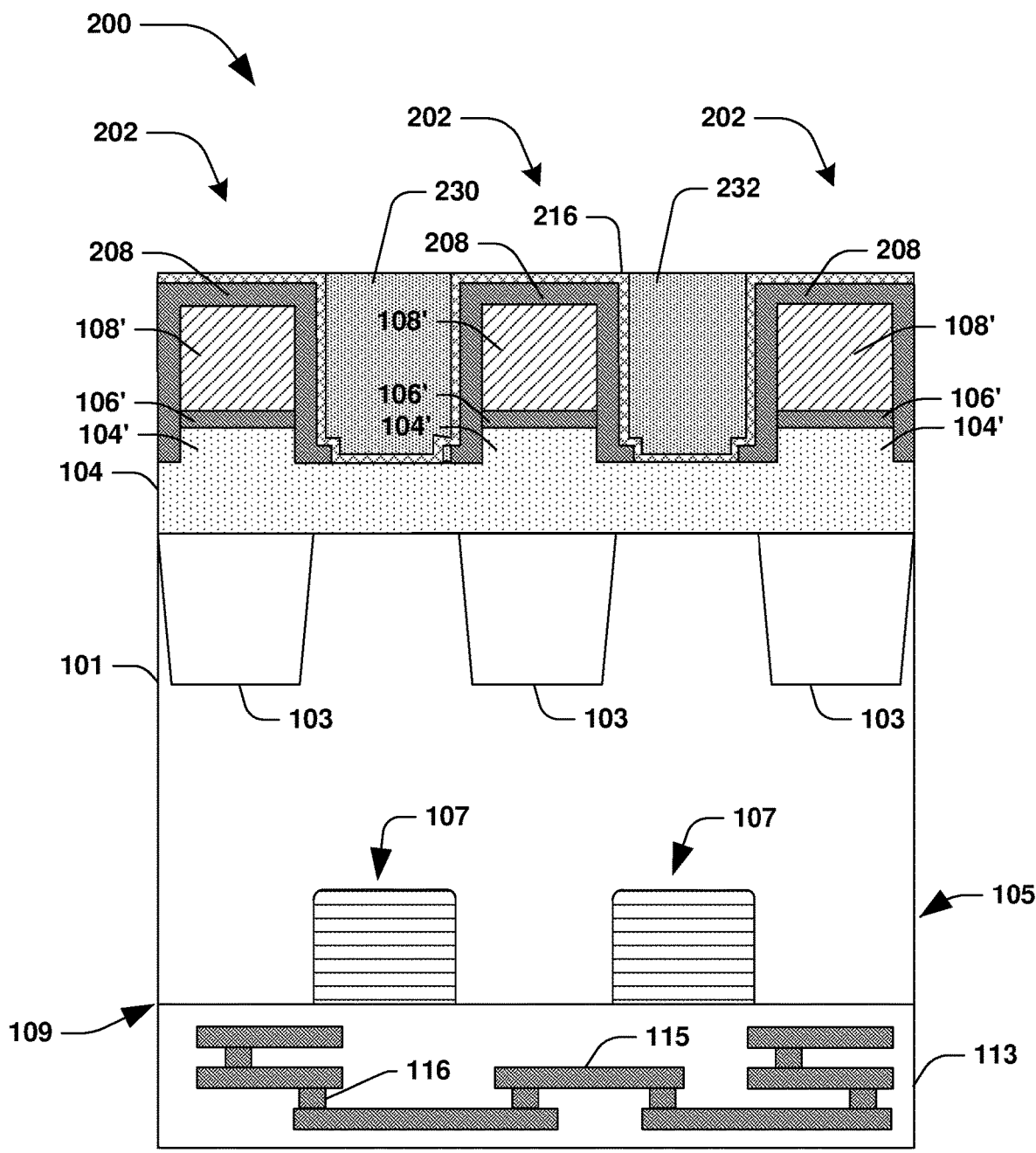

Referring to FIG. 2I, color filter materials 230, 232 are formed within the optical paths 117 between the grid structures 202, in accordance with some embodiments. In some embodiments, a first color filter material 230 is deposited between a first pair of adjacent grid structures 202 and overlying a first pixel 107 in order to filter certain wavelengths (colors) of radiation channeled through the first color filter material 230 to the first pixel 107. In some embodiments, a second color filter material 232 is deposited between a second pair of adjacent grid structures 202 and overlying a second pixel 107 in order to filter certain wavelengths (colors) of radiation channeled through the second color filter material 232 to the second pixel 107. In some embodiments, the first color filter material 230 and the second color filter material 232 have different material compositions to enable different wavelengths to be filtered. In some embodiments, the passivation layer 216 is disposed between the color filter materials 230, 232 and the first dielectric layer 104 or between the color filter materials 230, 232 and the portions of the substrate 101 overlying the pixels 107.

In some embodiments, the second barrier layer 208 provides isolation between the metal structures 108' and the passivation layer 216. In some embodiments, the second barrier layer 208 provides improved adhesion to the passivation layer 216 relative to a structure in which the second barrier layer 208 is not provided. In some embodiments, by providing isolation and adhesion, diffusion of the metal structures 108' through the passivation layer 216 is mitigated, thereby mitigating the possibility of the metal structures 108' causing interference in the optical paths 117.

Figure 3:
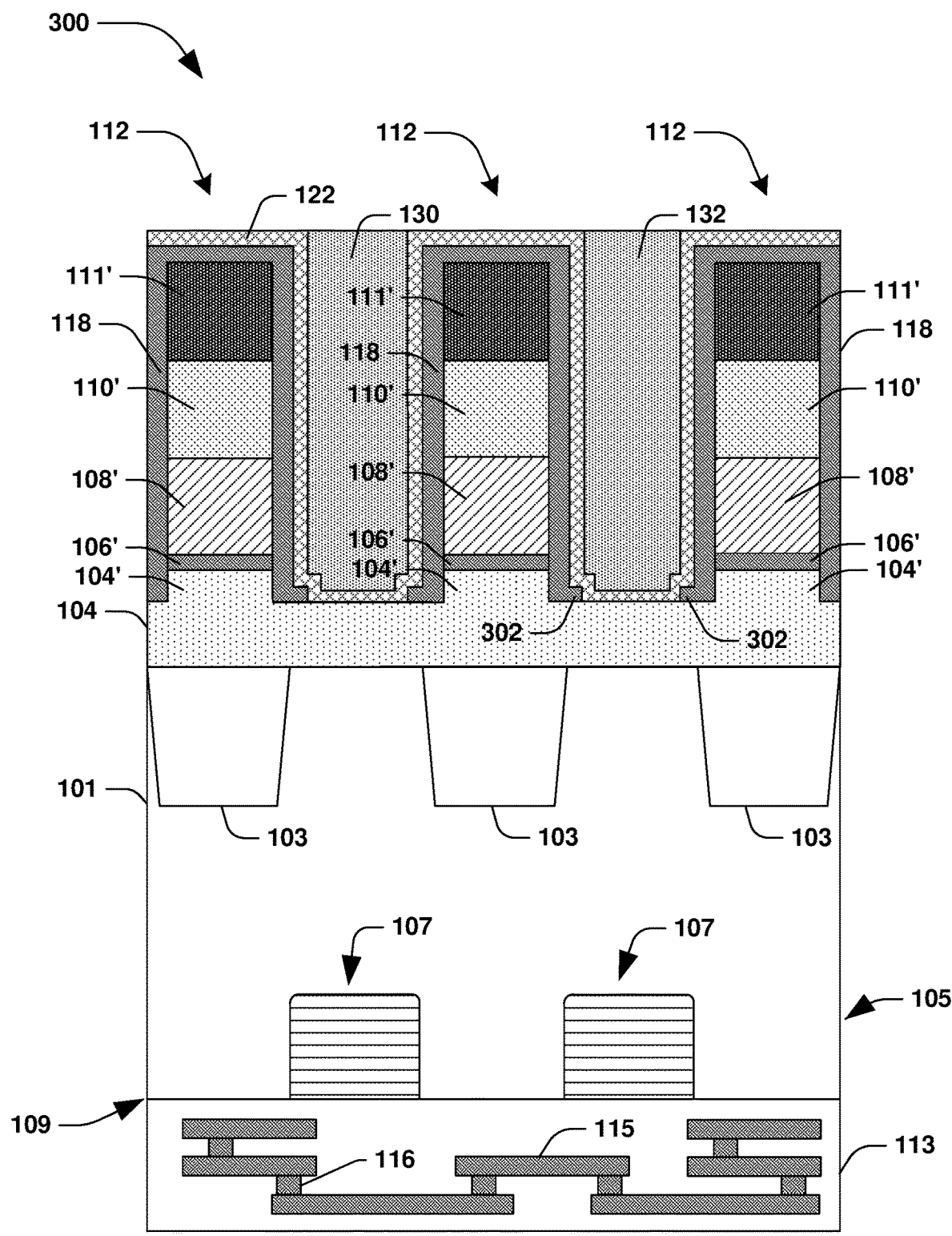
FIG. 3 is an illustration of a cross-sectional view of a semiconductor device, in accordance with some embodiments.

FIG. 3 is a cross-sectional view of a semiconductor device 300 formed with a second barrier layer 118, in accordance with some embodiments. The semiconductor device 300 differs from the semiconductor device 100 illustrated in FIG. 1J in that the second barrier layer 118 is etched according to the process described with respect to FIG. 2G, such that the second barrier layer 118 is disposed between a top surface of the third dielectric structures 111' and a bottom surface of the passivation layer 122. Moreover, in some embodiments due to using the photoresist mask for the etching process, portions 302 of the second barrier layer 118 overlie the pixels 107.

Figure 4:
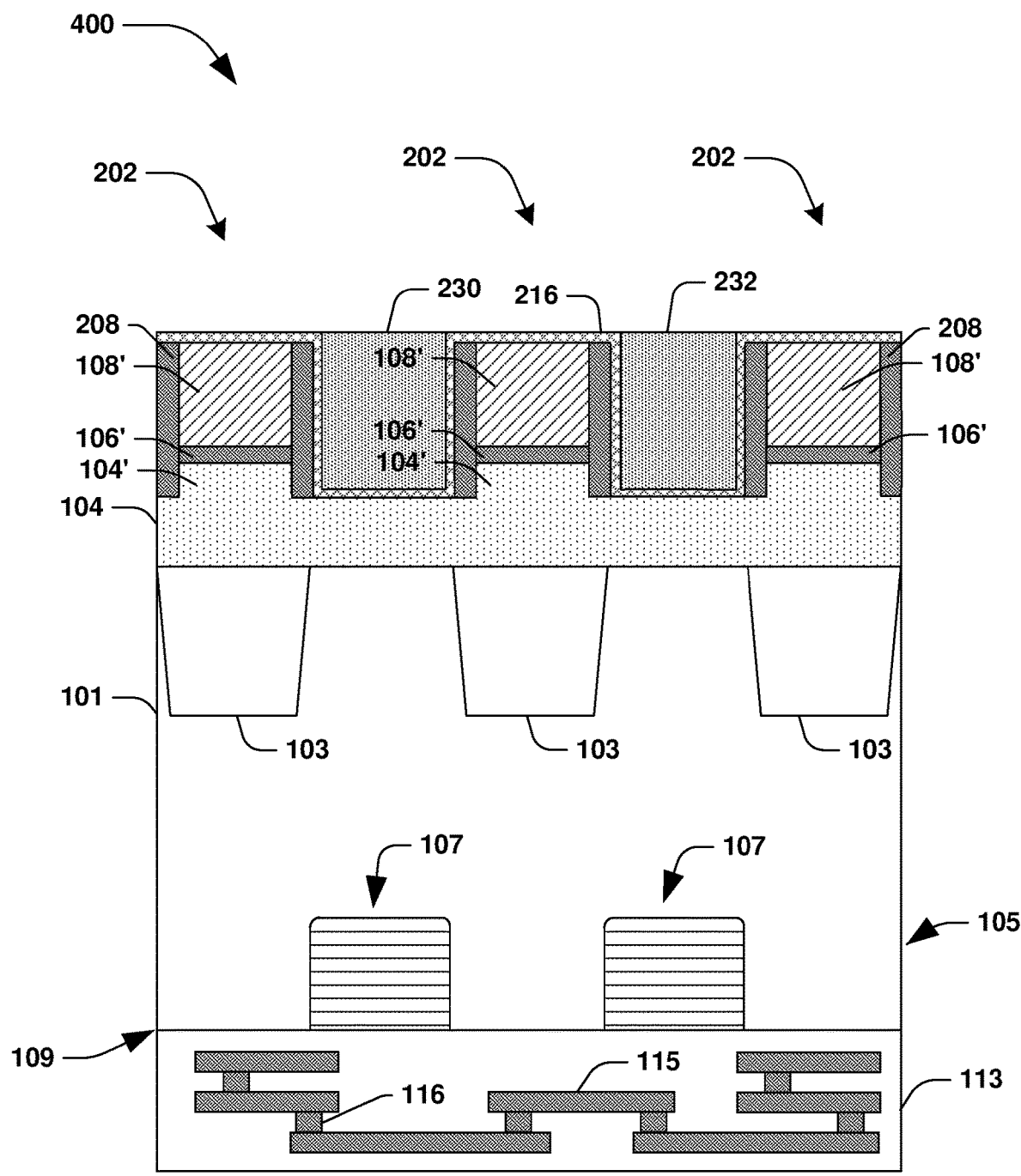
FIG. 4 is an illustration of a cross-sectional view of a semiconductor device, in accordance with some embodiments.

FIG. 4 is a cross-sectional view of a semiconductor device 400 formed with a second barrier layer 208, in accordance with some embodiments. The semiconductor device 400 differs from the semiconductor device 200 illustrated in FIG. 2I in that the second barrier layer 208 is etched according to the process described with respect to FIG. 1H, such that the second barrier layer 208 is removed from a top surface of the metal structure 108' and a top surface of the first dielectric layer 104.

FIG. 5 is a cross-sectional view of a semiconductor device 500 formed with a second barrier layer 118, in accordance with some embodiments. The semiconductor device 500 differs from the semiconductor device 100 illustrated in FIG. 1J in that the second barrier layer 118 is non-conformally formed over the grid structures 112 such that a width 502 of a first portion of the second barrier layer 118 is different than a width 504 of a second portion of the second barrier layer 118. In some embodiments, the width 504 near a bottom or a top of the second barrier layer 118 is greater than the width 502 of the second barrier layer 118 near a middle portion of the second barrier layer 118. It is to be appreciated that while the example embodiment illustrates the second barrier layer 118 as being non-conformally formed during that formation of a semiconductor device 500 similar to semiconductor device 100, the second barrier layer 118 may be non-conformally formed during the formation of any of the semiconductor devices 200, 300, 400 as well.

FIG. 6 is a cross-sectional view of a semiconductor device 600 formed with metal structures 108' that have a necked profile due to the etching process that removes a portion of the metal layer 108 to form the metal structures 108'. For example, in some embodiments, a width 602 in a middle portion of the metal structures 108' is less than a width 604 in a lower portion of the metal structures 108' below the middle portion and is less than a width 606 in an upper portion of the metal structure 108' above the middle portion. In some embodiments where the metal structures 108' have a necked profile, the second barrier layer 118 may be formed in a non-conformal manner such that a width of the second barrier layer 118 adjacent the middle portion of the metal structures 108' is greater than a width of the second barrier layer 118 adjacent the first barrier structure 106', the second dielectric structures 110', the third dielectric structures 111', etc. In some embodiments where the metal structures 108' have a necked profile, the second barrier layer 118 may be formed in a conformal manner and a width of the passivation layer 122 or a width of the color filters 130, 132 adjacent the middle portion of the metal structures 108' is greater than a width of the passivation layer 122 or a width of the color filters 130, 132 adjacent the first barrier structure 106', the second dielectric structures 110', the third dielectric structures 111', etc.

FIG. 7 is a cross-sectional view of a semiconductor device 700 formed with grid structures 112 that have a tapered profile due to the etching process or processes. In some embodiments, an average width 701 of the first dielectric structure 104' is larger than an average width 702 of the first barrier structure 106'. In some embodiments, the average width 702 of the first barrier structure 106' is larger than an average width 703 of the metal structure 108'. In some embodiments the average width 703 of the metal structure 108' is larger than an average width 704 of the second dielectric structure 110'. In some embodiments, the average width 704 of the second dielectric structure 110' is larger than an average width 705 of the third dielectric structure 111'.

In some embodiments, a semiconductor device is provided. The semiconductor device includes a pixel array comprising a first pixel and a second pixel. The semiconductor device includes a metal structure overlying a portion of a substrate between the first pixel and the second pixel. The semiconductor device includes a first barrier layer adjacent a sidewall of the metal structure. The semiconductor device includes a passivation layer adjacent a sidewall of the first barrier layer. The first barrier layer is between the passivation layer and the metal structure.

In some embodiments, a semiconductor device is provided. The semiconductor device includes a pixel array comprising a first pixel and a second pixel. The semiconductor device includes a first barrier layer overlying a portion of a substrate between the first pixel and the second pixel. The semiconductor device includes a metal structure overlying the first barrier layer and overlying a portion of a substrate between the first pixel and the second pixel. The semiconductor device includes a second barrier layer adjacent a sidewall of the metal structure and in contact with a sidewall of the first barrier layer.

In some embodiments, a method for forming a semiconductor device is provided. The method includes forming a metal structure over a first dielectric layer and overlying a portion of a substrate between a first pixel and a second pixel. The method includes forming a first barrier layer over the metal structure and the first dielectric layer. The method includes removing a portion of the first barrier layer over the first dielectric layer to expose a top surface of the first dielectric layer. The method includes forming a color filter over the top surface of the first dielectric layer after removing the portion of the first barrier layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, In an or more embodiments. Additionally, a variety of techniques exist for forming the layers features, elements, etc. mentioned herein, such as etching techniques, implanting techniques, doping techniques, spin-on techniques, sputtering techniques such as magnetron or ion beam sputtering, growth techniques, such as thermal growth or deposition techniques such as CVD, PVD, PECVD, or ALD, for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others skilled in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A method of forming a semiconductor device, comprising:
    forming a metal structure over a first dielectric layer and overlying a portion of a substrate between a first pixel and a second pixel;
    forming a first barrier layer over the metal structure and the first dielectric layer;
    removing a first portion of the first barrier layer over the first dielectric layer to expose a top surface of the first dielectric layer;
    forming a passivation layer over the top surface of the first dielectric layer after removing the first portion of the first barrier layer; and
    forming a color filter over the top surface of the first dielectric layer after forming the passivation layer such that a second portion of the first barrier layer is laterally between the color filter and the metal structure.

2. The method of claim 1, comprising:
    removing a third portion of the first barrier layer over the metal structure; and
    forming a passivation layer over the metal structure after removing the third portion of the first barrier layer.

3. The method of claim 1, comprising:
    forming a second barrier layer over the first dielectric layer prior to forming the metal structure.

4. The method of claim 3, wherein forming the first barrier layer comprises forming the first barrier layer to contact the second barrier layer.

5. The method of claim 1, comprising:
    forming a second dielectric layer over the metal structure prior to forming the first barrier layer.

6. The method of claim 5, wherein forming the first barrier layer comprises forming the first barrier layer to contact the second dielectric layer.

7. The method of claim 1, comprising:
    removing a portion of the first dielectric layer prior to forming the color filter to define a first dielectric structure under the metal structure.

8. The method of claim 1, comprising:
    forming a passivation layer over the top surface of the first dielectric layer after removing the first portion of the first barrier layer and prior to forming the color filter, wherein forming the color filter comprises forming the color filter such that the metal structure is separated from the color filter by the passivation layer and the first barrier layer.

9. The method of claim 1, wherein removing the first portion of the first barrier layer comprises removing a portion of the first barrier layer overlying the first pixel.

10. A method of forming a semiconductor device, comprising:
    forming a first barrier layer over a first dielectric layer;
    forming a metal structure over the first barrier layer and the first dielectric layer and overlying a portion of a substrate between a first pixel and a second pixel;
    forming a second barrier layer over the metal structure and the first dielectric layer;
    removing a first portion of the second barrier layer over the first dielectric layer to expose a top surface of the first dielectric layer; and
    forming a color filter over the top surface of the first dielectric layer after removing the first portion of the second barrier layer such that a second portion of the second barrier layer is laterally between the color filter and the metal structure.

11. The method of claim 10, comprising:
    removing a third portion of the second barrier layer over the metal structure; and
    forming a passivation layer over the metal structure after removing the third portion of the second barrier layer.

12. The method of claim 10, wherein forming the second barrier layer comprises forming the second barrier layer to contact the first barrier layer.

13. The method of claim 10, comprising:
    forming a second dielectric layer over the metal structure prior to forming the second barrier layer.

14. The method of claim 13, wherein forming the second barrier layer comprises forming the second barrier layer to contact the second dielectric layer.

15. The method of claim 10, comprising:
    forming a passivation layer over the top surface of the first dielectric layer after removing the first portion of the second barrier layer and prior to forming the color filter, wherein forming the color filter comprises forming the color filter such that the metal structure is separated from the color filter by the passivation layer and the second barrier layer.

16. A method of forming a semiconductor device, comprising:
    forming a metal structure over a first dielectric layer and overlying a portion of a substrate between a first pixel and a second pixel;
    forming a second dielectric layer over the metal structure;
    forming a first barrier layer over the metal structure and the first dielectric layer after forming the second dielectric layer;
    removing a first portion of the first barrier layer over the first dielectric layer to expose a top surface of the first dielectric layer; and
    forming a color filter over the top surface of the first dielectric layer after removing the first portion of the first barrier layer such that a second portion of the first barrier layer is laterally between the color filter and the metal structure.

17. The method of claim 16, comprising:
    removing a third portion of the first barrier layer over the metal structure; and
    forming a passivation layer over the metal structure after removing the third portion of the first barrier layer.

18. The method of claim 16, comprising:
    forming a passivation layer over the top surface of the first dielectric layer after removing the first portion of the first barrier layer and prior to forming the color filter, wherein forming the color filter comprises forming the color filter such that the metal structure is separated from the color filter by the passivation layer and the first barrier layer.

19. The method of claim 16, wherein forming the first barrier layer comprises forming the first barrier layer over the second dielectric layer.

20. The method of claim 16, comprising:
    removing a portion of the first dielectric layer prior to forming the color filter to define a first dielectric structure under the metal structure.

\* \* \* \* \*